United States Patent [19]

Nakayama et al.

[11] Patent Number: 4,900,622
[45] Date of Patent: * Feb. 13, 1990

[54] MAGNETIC RECORDING MEDIUM

[75] Inventors: Masatoshi Nakayama; Koji Kobayashi; Kunihiro Ueda; Mitsuru Takai; Shigeo Kurose, all of Nagano, Japan

[73] Assignee: TDK Corporation, Tokyo, Japan

[*] Notice: The portion of the term of this patent subsequent to Sep. 13, 2005 has been disclaimed.

[21] Appl. No.: 97,607

[22] Filed: Sep. 16, 1987

[30] Foreign Application Priority Data

Sep. 18, 1986 [JP] Japan ................................ 61-220522
Sep. 25, 1986 [JP] Japan ................................ 61-226689
Sep. 29, 1986 [JP] Japan ................................ 61-231035

[51] Int. Cl.$^4$ .............................................. G11B 5/64
[52] U.S. Cl. ...................................... 428/336; 427/41; 427/131; 427/132; 428/694; 428/900
[58] Field of Search ..................... 428/694, 900, 336; 427/41, 132, 131

[56] References Cited

U.S. PATENT DOCUMENTS

| 4,521,481 | 6/1985 | Nagao et al. | 428/900 |
| 4,548,864 | 10/1985 | Nakayama et al. | 428/900 |
| 4,565,734 | 1/1986 | Arai et al. | 427/41 |
| 4,599,266 | 7/1986 | Nakayama et al. | 428/336 |
| 4,657,812 | 4/1987 | Hatanai et al. | 428/694 |
| 4,693,799 | 9/1987 | Yanagihara et al. | 427/141 |
| 4,711,809 | 12/1987 | Nishikawa et al. | 428/694 |
| 4,713,287 | 12/1987 | Nishikawa et al. | 428/694 |
| 4,749,608 | 6/1988 | Nakayama et al. | 428/694 |
| 4,770,924 | 9/1988 | Takai et al. | 428/694 |

FOREIGN PATENT DOCUMENTS 0047321 2/1985 European Pat. Off. .

Primary Examiner—Paul J. Thibodeau
Attorney, Agent, or Firm—Oblon, Spivak, McClelland, Maier & Neustadt

[57] ABSTRACT

A magnetic recording medium comprising a ferromagnetic metal thin film comprised predominantly of cobalt on a substrate is improved in durability and performance by forming the ferromagnetic metal thin film as a multi-layered structure including at least two layers, one or both of which contain an organic polymer. A plasma-polymerized film may be provided as an interlayer between the layers of the metal thin film or as a topcoat.

24 Claims, 4 Drawing Sheets

MAGNETIC RECORDING MEDIUM

CROSS REFERENCE TO THE RELATED APPLICATIONS

Reference is made to U.S. Pat. No. 4,770,924, Takei et al, for Magnetic Recording Medium, assigned to the same assignee as the present invention and incorporated herein by reference.

BACKGROUND OF THE INVENTION

This invention relates to a magnetic recording medium, and more particularly, to a magnetic recording medium of the metal thin film type.

In the development of magnetic recording media for video, audio, and other applications, recent efforts were made on those having a magnetic layer in the form of a metal thin film because of compactness of a roll of tape. The preferred metal thin film for use as the magnetic layer of such media is a film of cobalt or cobalt-nickel alloy which is most often formed by oblique evaporation process wherein vacuum deposition of metal is conducted on a substrate at a varying incident angle with respect to a normal to the substrate.

In general, magnetic recording media having a magnetic layer in the form of a ferromagnetic metal thin film is advantageous over the conventional coating type magnetic recording media because the former can be made thinner due to the absence of a binder and exhibits a higher saturation magnetization. The magnetic layers of binder-free magnetic recording media are formed by electro-plating, electroless plating, sputtering, vacuum deposition, ion plating or another metallizing technique. Absent a binder, metallized magnetic layers tend to be abraded away or broken during movement in frictional contact with the magnetic head, that is, by friction due to high speed relative movement with the magnetic head during operations of recording, reproducing and erasing magnetic signals. The metallized magnetic layers are liable to corrosion on the surface. A progress of corrosion detracts from such important properties as head contact and abrasion resistance and adversely affects electromagnetic properties. Further, curling or cupping of the medium results in deteriorated head contact and output variation.

One approach for reducing impact and friction to magnetic recording media is the application of lubricant on the surface of the magnetic layer as disclosed in Japanese Patent Publication No. 39-25246. For continuously supplying lubricant to the magnetic layer surface, it was proposed in Japanese Patent Publication No. 57-29769 to form a lubricating backcoat layer comprising a liquid or semi-solid lubricant and an organic binder on the surface of a magnetic recording medium opposite to the magnetic layer. When the magnetic recording medium is wound in a roll form, the lubricant blooming out of the backcoat layer migrates to the surface of the adjoining turns of the magnetic layer. The lubricant is thus continuously supplied to the surface of the magnetic layer which is increased in durability as demonstrated by mar and peel and can readily accommodate with a change of coefficient of dynamic friction.

The approach of Japanese Patent Publication No. 39-25246 suffers from the disadvantage that lubrication does not last and improvements in rust prevention and durability are not expectable because the lubricant is taken away by the head and other guide members. The provision of a lubricated backcoat by Japanese Patent Publication No. 57-29769 without forming a topcoat on the magnetic layer is still insufficient to reduce the friction between the magnetic layer and the head, incurring movement errors. When the lubricant is transferred from the backcoat layer to the magnetic layer uncovered with a topcoat, —although evaporated films having no oxygen incorporated therein (oxygen-free metallized films as disclosed in Japanese Patent Publication No. 57-29769) are not significantly affected—, commonly used evaporated films having oxygen incorporated therein (oxygen-containing metallized films) become unstable, incurring many problems including an output drop, head clogging, unfeasible image reproduction, relatively high frictional resistance, wear-out or even rupture of the films.

Like the approach of incorporating lubricant in the backcoat, it was also proposed to coat lubricant to a topcoat. The lubricant coating can reduce friction only for a limited period and it is also insufficient to improve rust prevention, corrosion resistance, and durability.

One effective topcoat applied to the magnetic metal thin film formed by the oblique evaporation process is a plasma-polymerized film of hydrocarbon as disclosed in Japanese Patent Application Kokai Nos. 59-72653, 59-154641, and 59-160828. Plasma-polymerized films formed by prior art methods, however, are still insufficient in corrosion resistance, runnability, and strength.

For the purpose of improving durability and electromagnetic properties, it is proposed to form a ferromagnetic metal thin film as a multi-layered structure of two or more layers. Reference is made to Japanese Patent Application Kokai Nos. 54-141608 and 57-130228, and Japanese Patent Publication No. 56-26892. Again, curling or cupping of the medium results in deteriorated head contact and output variation.

None of the prior art techniques have been successful in improving runnability, durability, ferromagnetic metal thin film strength, and curling or cupping while maintaining electromagnetic properties.

SUMMARY OF THE INVENTION

An object of the present invention is to provide a new and improved magnetic recording medium of the type having a ferromagnetic metal thin film on a non-magnetic substrate which exhibits improved runnability and durability, little crack or wear on the magnetic layer, minimized dropouts, and minimized head abrasion, and is relatively free of curling or cupping while maintaining excellent electromagnetic properties.

The present invention is directed to a magnetic recording medium comprising a plastic substrate having opposed major surfaces, and a ferromagnetic metal thin film on one substrate major surface predominantly comprising cobalt. The feature of the present invention resides in that the ferromagnetic metal thin film has a multi-layered structure consisting of at least two layers, at least one of which contains carbon. For brevity of description, the two layers are a lowermost layer adjoining the substrate and an uppermost layer remote from the substrate.

In one preferred embodiment, these layers have specific oxygen concentrations at their boundaries. More particularly, the quotient $C_2/C_1$ is up to 0.3 provided that the lowermost layer has an oxygen concentration $C_2$ in proximity to its interface with the substrate and the uppermost layer has an oxygen concentration $C_1$ in proximity to its surface remote from the substrate.

Preferably, the quotient C3/C1 ranges from 0.1 to 3.0 provided that a layer directly adjoining the uppermost layer has an oxygen concentration C3 in proximity to its interface with the uppermost layer and the uppermost layer has an oxygen concentration C1 in proximity to its surface remote from the substrate.

An embodiment is contemplated preferable that satisfies the above-defined ranges of both quotients C2/C1 and C3/C1.

In a further preferred embodiment of the present invention, in a magnetic recording medium as defined above, the layers are formed by evaporating a ferromagnetic metal material in the presence of oxygen, the minimum incident angle at which the evaporated metal material is deposited on the substrate is set up to 50° during formation of the lowermost layer and ranges from 20° to 90° during formation of the uppermost layer. The quotients C2/C1 and C3/C1 are within the above-defined ranges.

Most often, the ferromagnetic metal thin film is of a two layer structure. It provides the top surface having C1, the interface between the upper and lower layers having C3, and the lower surface adjoining the substrate having C2.

The magnetic recording medium as defined above may be further provided with a topcoat layer on the ferromagnetic metal thin film. The topcoat layer is a plasma-polymerized film containing carbon, fluorine, and optionally, hydrogen, the carbon content ranging from 30 to 80 atom %.

The magnetic recording medium as defined above may be further provided with a plasma-polymerized film disposed between the lowermost layer and the substrate, or between any two adjoining layers of the ferromagnetic metal thin film, or on the surface of the uppermost layer remote from the substrate.

BRIEF DESCRIPTION OF THE DRAWINGS

The above and other objects, features, and advantages of the present invention will be better understood by reading the following description taken in conjunction with the accompanying drawings, in which.

DETAILED DESCRIPTION OF THE INVENTION

Magnetic layer

The magnetic recording medium according to the present invention has a magnetic layer in the form of a predominantly cobalt ferromagnetic metal thin film on one major surface of a plastic substrate. The ferromagnetic metal thin film used as the magnetic layer has a multi-layered structure consisting of at least two layers, that is, at least a lowermost layer adjoining the substrate and an uppermost layer remote from the substrate. The ferromagnetic metal thin film layers each preferably consists of a coalescence of columnar crystal particles inclined with respect to a normal to the substrate major surface because of excellent electromagnetic properties as will be fully described later.

According to the present invention, at least one of the magnetic layers of the ferromagnetic metal thin film contains carbon preferably in the form of an organic polymer. The organic polymer is present in the magnetic layer so as to fill in between columnar particles forming the layer. The organic polymer is sufficiently dense to prevent direct contact of the magnetic layer columnar particles with oxygen molecules in air.

The carbon-containing layer preferably has an atom ratio of carbon to metal in the range of from $10^{-8}$:1 to $10^{-2}$:1. Outside the range, the layer exhibits a reduced output, low coercive force, and less improved corrosion resistance. The atom ratio of carbon/metal in the magnetic layer may be readily determined by identifying the composition of the magnetic layer by Auger spectroscopy or secondary ion mass spectroscopy (SIMS).

It suffices for the present invention that carbon is contained in at least one layer. The carbon-containing layer may be any of the layers of the ferromagnetic metal thin film although it is preferably the uppermost layer. Most preferably, all the layers contain carbon. It is preferred that the entire ferromagnetic metal thin film, i.e., the total of the layers has an atom ratio of carbon to metal in the range of from $10^{-8}$:1 to $10^{-2}$:1.

The preferred organic polymers used herein are those containing carbon and hydrogen. The atomic ratio of carbon to hydrogen (C/H) preferably ranges from about 1:1 to about 6:1. Fluorine-containing polymers are also useful.

The organic polymer may be incorporated into the magnetic layer by the following, non-limiting method.

Figure 5:
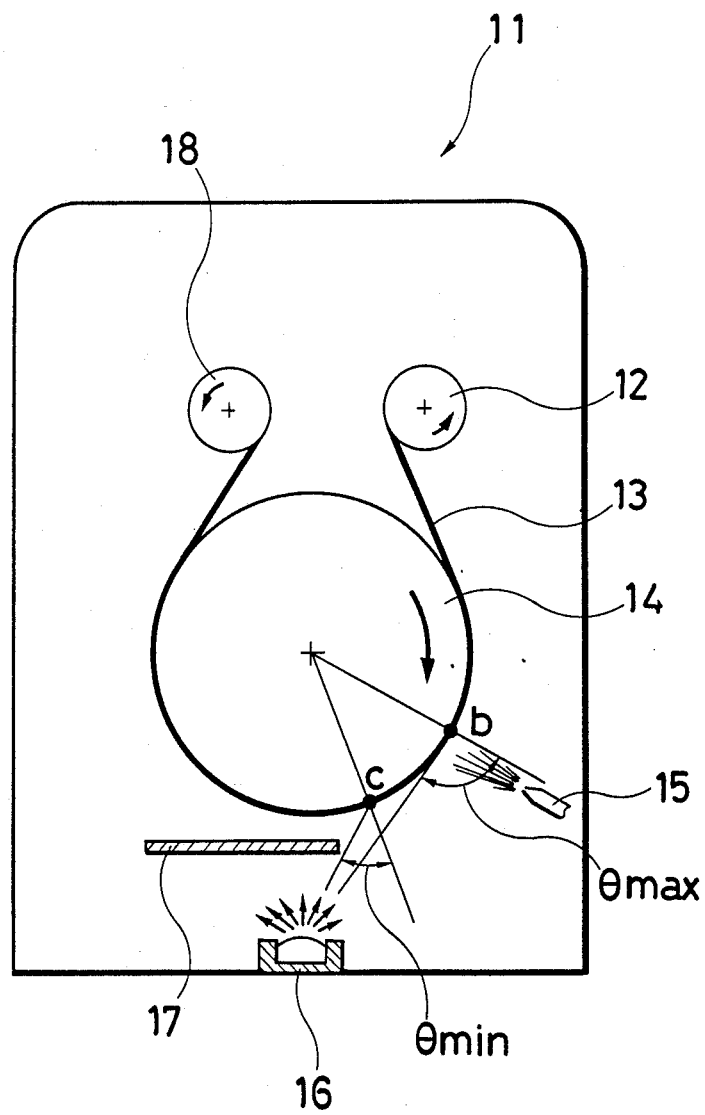
FIG. 5 is a schematic illustration of an oblique evaporation apparatus.
Figure 6:
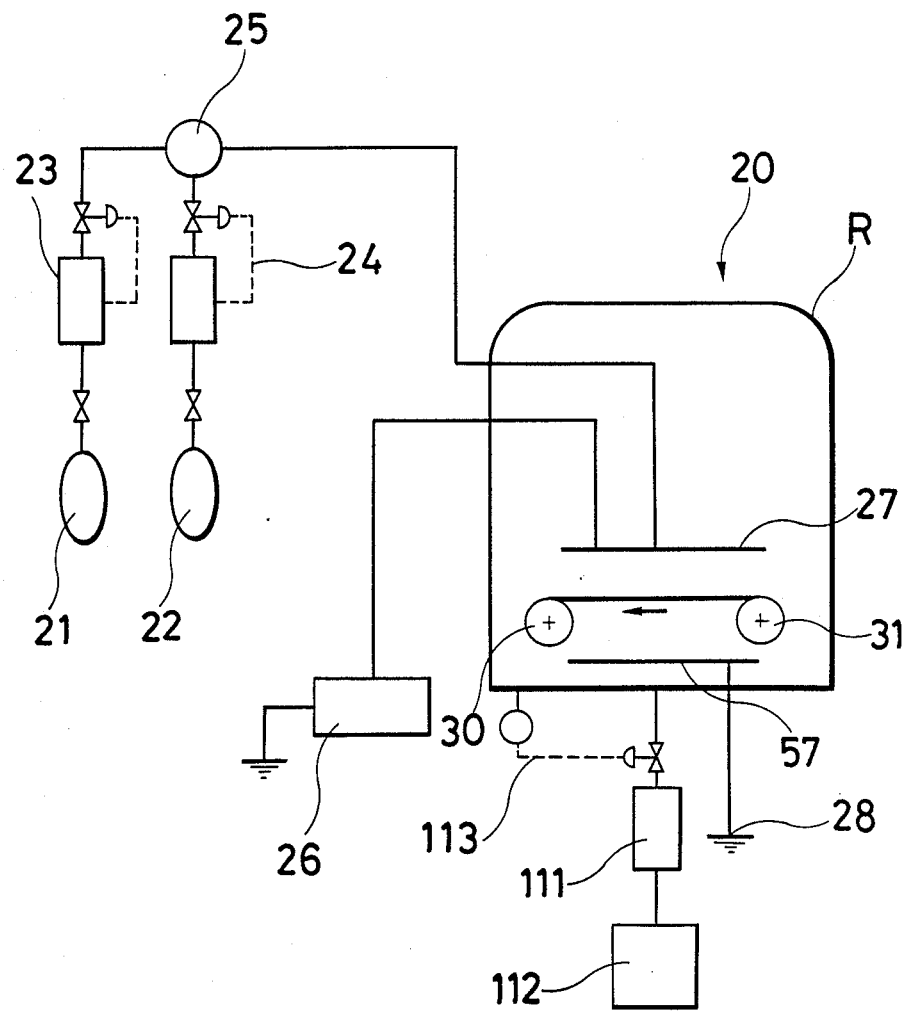
FIG. 6 is a schematic illustration of a plasma treating apparatus.

Referring to FIGS. 5 and 6, there are illustrated apparatus for use in the preparation of the medium according to the present invention. FIG. 5 illustrates an evaporation apparatus for forming a magnetic layer while incorporating an organic compound therein. FIG. 6 illustrates a plasma processing apparatus as a typical apparatus for polymerizing the organic compound.

The evaporation apparatus generally designated at 11 in FIG. 5 include a housing for defining a vacuum chamber, a supply roll 12 having a substrate in the form of a length of web 13 wound thereon, a rotating cooling drum 14, and a take-up roll 18 for taking up the web 13. The web 13 is fed from the supply roll 12 to the take-up roll 18 via the cooling drum 14. Disposed in the chamber is a nozzle 15 for forming a jet of organic material gas toward the drum. The nozzle 15 is disposed and oriented so that the jet impinges the drum or web within a magnetic metal depositing region b-c as will be defined below. Disposed at the bottom of the chamber is an evaporation source in the form of a hearth 16 containing a magnetic metal material therein. A shield 17 is disposed between the drum 14 and the hearth 16.

Metal material is evaporated from the hearth 16 and deposited on the web 13 at progressively varying incident angles from the maximum incident angle θmax to the minimum incident angle θmin, forming a magnetic layer. As seen from FIG. 5, the maximum incident angle $\theta$max is defined between a tangent from the hearth 16 to the circumference of the drum 14 and a radial line connecting the drum center and the tangential point b, and the minimum incident angle $\theta$min is defined between a line connecting the hearth 16 and the edge of the shield 17 and a radial line connecting the drum center and the crossing c between the line and the drum circumference. In the practice of the present invention, the organic material gas is ejected from the nozzle 15 during magnetic layer formation so that the organic material is incorporated in the magnetic layer being formed. The point of impingement of the jet of organic material gas on the web must fall within the region extending between the tangential point b and the crossing c.

The organic materials used herein are those organic compounds which become gaseous at a vacuum of about $10^{-5}$ Torr. Illustrative of the organic materials are (A) saturated or unsaturated hydrocarbons such as methane, ethane, propane, butane, pentane, ethylene, propylene, butene, butadiene, acetylene, methylacetylene, benzene, styrene, etc.;

(B) saturated or unsaturated fluorinated hydrocarbons such as fluoromethane, difluoromethane, trifluoromethane, difluoroethane, tetrafluoroethane, etc.;

(C) saturated or unsaturated fluorocarbons such as tetrafluoromethane, hexafluoroethane, octafluoropropane, octafluorocyclobutane, tetrafluoroethylene, hexafluoropropylene, etc.; and (D) other monomers such as methyl methacrylate, acrylic acid, vinyl chloride, vinylidene chloride, etc. Preferred among them are those having up to 3 carbon atoms such as methane, ethane, ethylene, acetylene, propane, propylene, methylacetylene, tetrafluoromethane, and tetrafluoroethylene. Generally, one compound selected from groups (A) to (D) may be used alone as a reactant gas although a mixture of two or more may be used. If desired, minor proportions of trace elements such as nitrogen, oxygen, boron and phosphorus may be added to the reactant.

The organic compound gas is introduced into the magnetic layer being formed within the magnetic metal depositing region b-c (see FIG. 5) so that evaporated particles of the organic compound may contact evaporated metal particles forming the magnetic layer. The flow rate of the organic compound gas may be properly chosen depending on the volume of the vacuum chamber and other factors although a flow rate of about 10 to 1,000 SCCM (standard cubic centimeter) is usually employed.

It should be understood that when the magnetic layer is formed by a method other than vacuum deposition, for example, by ion plating or sputtering, the above-mentioned technique for introducing the organic compound may be similarly applied without substantial modification.

The organic compound thus incorporated in the magnetic layer during its formation is then polymerized, for example, using a polymerizing apparatus. Polymerizing means installed in the polymerizing apparatus is not critical. Usually employed are (1) plasma means for effecting polymerization in a plasma atmosphere and (2) irradiation means for effecting polymerization by exposure to radiation such as electron radiation and ultraviolet radiation. It will be understood that when irradiation means is used for polymerization purpose, the organic compound incorporated in the magnetic layer is limited to those having a multiple bond such as ethylene, acetylene, propylene, butadiene, styrene, and benzene.

FIG. 6 illustrates a polymerizing apparatus 20 having plasma means for polymerizing the organic compound incorporated in the magnetic layer in a plasma atmosphere. The plasma atmosphere may be created using an inorganic gas such as $H_2$, $O_2$, $N_2$, Ar, He, and Ne, and activating the gas into an electric discharge plasma.

The principle of plasma operation 11 be briefly described. When an electric field is applied to a gas kept at a reduced pressure, free electrons which are present in a minor proportion in the gas and have a remarkably greater inter-molecular distance than under atmospheric pressure are accelerated under the electric field to gain a kinetic energy (electron temperature) of 5 to 10 eV. These accelerated electrons collide against atoms and molecules to fracture their atomic and molecular orbitals to thereby dissociate them into normally unstable chemical species such as electrons, ions, neutral radicals, etc. The dissociated electrons are again accelerated under the electric field to dissociate further atoms and molecules. This chain reaction causes the gas to be instantaneously converted into highly ionized state. This is generally called a plasma. Since gaseous molecules have a less chance of collision with electrons and absorb little energy, they are kept at a temperature approximate to room temperature. Such a system in which the kinetic energy (electron temperature) of electrons and the thermal motion (gas temperature) of molecules are not correlated is designated a low temperature plasma. In this system, chemical species set up the state capable of additive chemical reaction such as polymerization while being kept relatively unchanged from the original. The present invention utilizes this state to effect polymerization by exposing the organic compound incorporated in the magnetic layer to a plasma atmosphere. The use of a low temperature plasma avoids any thermal influence on the substrate and the magnetic layer itself.

Referring to FIG. 6, the plasma polymerizing apparatus 20 includes a reactor vessel R into which a treating gas or gases are introduced from a source 21 and/or 22 through a mass flow controller 23 and/or 24. When desired, different gases from the sources 21 and 22 may be mixed in a mixer 25 to introduce a gas mixture into the reactor vessel. The treating gases may be fed each at a flow rate of 1 to 250 ml per minute.

Disposed in the reactor vessel R is means for supporting the web, in this embodiment, a set of supply and take-up rolls 31 and 30 on which the web is wound. The web is moved from the supply roll 31 to the take-up roll 20 through a plasma region where the organic compound is polymerized within the magnetic layer.

On the opposed sides of the web are located a pair of electrodes 27 and 57, one electrode 27 being connected to a variable frequency power source 26 and the other electrode 57 being grounded at 28.

The reactor vessel R is further connected to a vacuum system for evacuating the vessel, including a liquefied nitrogen trap 111, an oil rotary vacuum pump 112, and a vacuum controller 113. The vacuum system has the capacity of evacuating and keeping the reactor vessel R at a vacuum of 0.01 to 10 Torr.

In operation, the reactor vessel R is first evacuated by means of the vacuum pump to a vacuum of $10^{-3}$ Torr or lower before a treating gas or gases are fed into the vessel at a predetermined flow rate. Then the interior of the reactor vessel is maintained at a vacuum of 0.01 to 10 Torr. A take-up roll motor (not shown) is turned on to transfer the substrate. When the flow rate of the gas mixture and the rate of transfer of the substrate become constant, the variable frequency power 26 is turned on to produce a plasma with which the travelling substrate is plasma treated, that is, the organic compound is plasma polymerized within the magnetic layer.

The treating gases used in the plasma treatment may preferably be hydrogen, oxygen, nitrogen, argon, neon, and helium gases as previously mentioned. They may be generally used alone although a mixture of two or more may be used if desired.

The plasma treatment may be conducted at such parameters as a chamber vacuum of about 0.01 to 10 Torr, a frequency of about 10 KHz to 2 GHz, and a power of about 0.5 to 5 kilowatts. These parameters may be empirically determined for a particular apparatus because they affect the nature of the magnetic layer.

When radiation exposure is used instead of the plasma polymerization mentioned above to carry out polymerization of the organic compound incorporated in the magnetic layer, the apparatus shown in FIG. 6 is replaced by any suitable one of various well-known radiation exposure apparatus. The active energy radiation used in polymerization may be such radiation as electron radiation produced by a radiation accelerator, gamma-rays emitted from a Co60 source, beta-rays emitted from a Sr90 source, x-rays produced by an x-ray generator, and ultraviolet radiation. The use of electron radiation produced by a radiation accelerator is advantageous from the standpoints of dose control, combination with the manufacturing line, and shielding of ionized radiation.

Preferably radiation is applied so as to provide a dose in the range of 0.5 to 20 Mrad by operating a radiation accelerator at an accelerating voltage of 100 to 750 kilovolts, especially 150 to 300 kilovolts because of penetrating power.

In the practice of polymerization process, a radiation accelerator such as a low dose radiation accelerator of the electro-curtain system as available from Energy Science Corporation of U.S. is advantageous from the standpoints of dose control, combination with the tape manufacturing line, and shielding of secondary radiation within the accelerator. Also useful is a van de Graaf type accelerator which are widely used as a radiation accelerator in the prior art.

It is important in radiation crosslinking to expose the organic compound to radiation in an inert gas stream such as nitrogen and helium gases. Exposure to radiation in air is inconvenient because $O_3$ and other species can be produced by radiation exposure which prevent radicals created in the organic compound from advantageously participating in polymerization reaction. The atmosphere in which the organic compound is exposed to active energy rays should be an inert gas atmosphere of nitrogen, helium, carbon dioxide or the like having an oxygen content of at most 5%.

Polymerization of the organic compound incorporated in the magnetic layer in this way results in a medium which experiences minimized curling or cupping. The medium can thus produce a stable output while exhibiting improved corrosion resistance and runnability.

Preferably, the ferromagnetic metal thin film used in the practice of the present invention has a composition comprising a major proportion of cobalt (Co), oxygen (O), and if desired, at least one element selected from nickel (N)) and chromium (Cr). The metal thin film may preferably consist essentially of Co alone or Co and Ni as metallic elements. When it is formed from cobalt and nickel, the weight ratio of Co/Ni is preferably 3/2 or higher. In addition to Co alone or Co plus Ni, the metal thin film may contain chromium (Cr). Preferably, the weight ratio of Cr/Co (when nickel free) or Cr/(Co+Ni) ranges from 1:1000 to 1:10, especially from 5:1000 to 5:100.

The ferromagnetic metal thin film further contains oxygen (O) atoms. The average oxygen amount throughout the metal thin film is such that the uppermost layer has an average oxygen concentration $C1^*$ expressed as O/Co or O/(Co+Ni) atom ratio of from about 1:10 to about 5:10, more preferably from about 1:10 to about 4:10. Magnetic layers having an average oxygen concentration $C1^*$ of less than 0.1 are unsatisfactory in corrosion resistance, runnability, crack resistance, and wear resistance. An average oxygen concentration $C1^*$ of more than 0.5 indicates excess growth of a surface oxide coating which increases the spacing to the head, incurring an output loss.

According to the preferred embodiment of the present invention, the quotient $C2/C1$ is up to 0.3, more preferably up to 0.15 provided that the lowermost layer has an oxygen concentration $C2$, more precisely O/Co or O/(Co+Ni) atom ratio in proximity to its interface with the substrate and the uppermost layer has an oxygen concentration $C1$, more precisely O/Co or O/(Co+Ni) atom ratio in proximity to its surface remote from the substrate.

The oxygen concentration may be determined by Auger spectroscopy or secondary ion mass spectroscopy (SIMS) by ion milling or etching the ferromagnetic metal thin film with argon (Ar) or the like. While the film is subjected to ion etching, the numbers of O, Co, and Ni atoms are counted to determine their profiles in a film thickness direction, from which the atom ratio is calculated. The O/Co or O/(Co+ Ni) at the surface of the ferromagnetic metal thin film remote from the substrate is regarded as $C1$. For the lowermost layer, the O/Co or O/(Co+Ni) value given just before carbon (C) atoms become countable as a result of etching proceeding to the plastic substrate past the metal thin film is regarded as $C2$. The procedures of ion etching and Auger spectroscopy or SIMS may be as usually employed in the art. It is to be noted that Auger spectroscopy includes continuous and alternate modes relating to ion etching. Although the continuous and alternate modes of Auger spectroscopy give somewhat different results, such a difference due to the measurement mode is not significant for the purpose of this description. The continuous mode is thus employed throughout the disclosure.

The magnetic layer exhibits an increased coercive force Hc because of the relatively high oxygen concentration of the uppermost layer at the surface. It also exhibits an increased maximum residual magnetic flux $\phi r$ and squareness ratio Sq because of the relatively low oxygen concentration of the lowermost layer at the interface, offering very good electromagnetic properties as a whole.

In the preferred embodiment of the present invention, the quotient $C3/C1$ ranges from 0.1 to 3.0, more preferably from 0.2 to 2.0 provided that a layer directly adjoining the uppermost layer has an oxygen concentration $C3$, more precisely O/Co or O/(Co+Ni) atom ratio in proximity to its interface with the uppermost layer and the uppermost layer has an oxygen concentration C1, more precisely O/Co or O/(Co+Ni) atom ratio in proximity to its surface remote from the substrate. It will be understood that the uppermost layer-adjoining layer is equal to the lowermost layer in the case of a two-layer structure.

The oxygen concentration C1, O/Co or O/(Co+Ni) at the surface of the uppermost layer remote from the substrate may be measured as described above. The oxygen concentration C3, O/Co or O/(Co +Ni) at the interface between the uppermost layer-adjoining layer and the uppermost layer may be determined by calculating the O/Co or O/(Co+Ni) from the counts obtained at the end of etching just corresponding to the thickness of the uppermost layer. Under usual depositing conditions, the oxygen concentration of each layer becomes maximum at its surface remote from the substrate. This means that the maximum obtained when the number of O atoms is counted through the relevant layers while effecting ion etching is usually regarded as C3.

The magnetic layer exhibits an increased coercive force Hc because of the relatively high oxygen concentration C1 of the uppermost layer at the surface. It also exhibits an increased maximum residual magnetic flux φr and squareness ratio Sq because of the relatively low oxygen concentration of a region of the uppermost layer which extends from below the uppermost layer surface to near the uppermost layer-adjoining layer as compared with C1, offering very good electromagnetic properties as a whole. Then signals having a relatively shallow magnetic field and a center frequency of about 5 MHz are effectively held in the uppermost layer.

Within the range of quotient C3/C1 between 0.1 and 3.0, when the oxygen concentration C3, O/Co or O/(Co+Ni) in proximity to the interface between the uppermost layer-adjoining layer and the uppermost layer is set relatively high, a region near this interface has a relatively high coercive force Hc. The magnetic layer also exhibits an increased maximum residual magnetic flux φr and squareness ratio Sq because of the relatively low oxygen concentration of a region of the uppermost layer-adjoining layer which extends downward from below the interface with the uppermost layer as compared with C3, offering very good electro-magnetic properties as a whole. Then signals having a relatively deep magnetic field and a center frequency of about 0.75 MHz are effectively held in the uppermost layer-adjoining layer and any lower layer.

The magnetic layer as a whole exhibits a good profile of electromagnetic properties and corrosion resistance when quotient C3/C1 ranges from 0.1 to 3.0.

The oxygen concentration C1 expressed as O/Co or O/(Co+Ni) in proximity to the surface of the metal thin film remote from the substrate generally ranges from 0.2 to 0.7, preferably from 0.3 to 0.6.

The oxygen concentration C2 expressed as O/Co or O/(Co+Ni) in proximity to the interface of the metal thin film with the substrate generally ranges from 0.06 to 0.21, preferably from 0.09 to 0.18.

The oxygen concentration C3 expressed as O/Co or O/(Co+Ni) in proximity to the interface between the uppermost layer-adjoining layer and the uppermost layer generally ranges from 0.07 to 0.6, preferably from 0.1 to 0.5.

The average oxygen concentration C1* expressed as O/Co or O/(Co+Ni) of the entire uppermost layer preferably ranges from 0.1 to 0.5, more preferably from 0.1 to 0.4. The average oxygen concentration C2* expressed as O/Co or O/(Co+Ni) of the entire lowermost layer is preferably up to 0.5, more preferably up to 0.3. The average oxygen concentration expressed as O/Co or O/(Co+Ni) of the entire uppermost layer-adjoining layer is preferably up to 0.5, more preferably up to 0.3. Within these ranges, there are observed marked improvements in electromagnetic properties, corrosion resistance, runnability, and magnetic layer strength.

In the case of a multi-layered structure having more than two layers, each of the layers has an average atom ratio O/Co or O/(Co+Ni) of up to 0.5, preferably up to 0.3 over its entirety.

On the surface of each of layers of the ferromagnetic metal thin film, oxygen is present as oxides with the ferromagnetic metal or metals, typically cobalt and nickel. In a zone of each layer which extends 100–2,000 Å, more preferably 500–1,000 Å deep from its upper surface, a peak indicative of oxide is observed by Auger spectroscopy.

In order that the benefits of the present invention be best attained, the present invention controls the oxygen concentrations near the upper and lower surfaces of the ferromagnetic metal thin film which are disposed remote from and adjacent to the substrate, respectively, and/or the oxygen concentrations near the surface of the ferromagnetic metal thin film remote from the substrate and the interface of the uppermost layer-adjoining layer with the uppermost layer. The exact profile of oxygen in the ferromagnetic metal thin film in a thickness direction is not particularly limited in the broadest scope of the present invention as long as the above-defined quotient ranges are met. For example, the oxygen profile may be a decline in a thickness direction toward the substrate interface, or a zig-zag curve as long as only quotient C2/C1 is concerned, or may involve a peak at an intermediate, for example, at the interface between the uppermost layer and the uppermost layer adjoining layer as long as quotient C3/C1 is concerned.

In general, the ferromagnetic metal thin film may be formed of two layers, but it may be formed of three or more layers, particularly three, four, or five layers, if desired.

The ferromagnetic metal thin film may further contain trace amounts of other elements, for example, transition metal elements such as Fe, Mn, V, Zr, Nb, Ta, Ti, Zn, Mo, W, Cu, etc.

The ferromagnetic metal thin film has a total thickness of about 0.05 μm to 0.5 μm, preferably about 0.07 to about 0.3 μm. The ratio of the thicknesses of the layers of the ferromagnetic metal thin film is not particularly limited in the broadest scope. In the case of the two layer structure, for example, the ratio of the thicknesses of the upper and lower layers may range from about 1:10 to about 10:1. Preferably, the uppermost layer is thinner than the lowermost layer. Most often, the ratio in thickness of the uppermost to lowermost layer may range from about 2:10 to about 9:10, most preferably from about 4:10 to 9:10. In the case of three or more layered structures, an intermediate layer or layers may have a thickness between those of the uppermost and lowermost layers.

The ferromagnetic metal thin film-forming layers preferably consist of coalesced particles of columnar crystal structure each directed at an angle with respect to a normal to the major surface of the substrate because of better electromagnetic properties. In general, the columnar particles have a length extending throughout each layer in its thickness direction, while the angle of their orientation with respect to a normal to the substrate major surface is not particularly limited. Preferably, the minimum angle between the longitudinal direction of columnar grains and a normal to the substrate major surface ranges from 20° to 90°, more preferably from 20° to 50° in the uppermost layer, and up to 50°, more preferably from 0° to 40° in the lower-most layer. In the lowermost layer, grains extend at a steep inclination or rather upright. In any intermediate layer in a structure having more than two layers, the angle of columnar particles with respect to a normal to the substrate major surface is not particularly limited as long as it is generally between those for the uppermost and lowermost layers.

For two adjoining layers, the orientations of inclined particles with respect to a normal to the substrate major surface may be the same in a longitudinal direction of the substrate, but preferably opposite to each other. The orientation of inclined particles with respect to a normal to the substrate major surface is illustrated in FIGS. 1 and 2 wherein the two layer structure is shown as a typical example.

Figure 1:
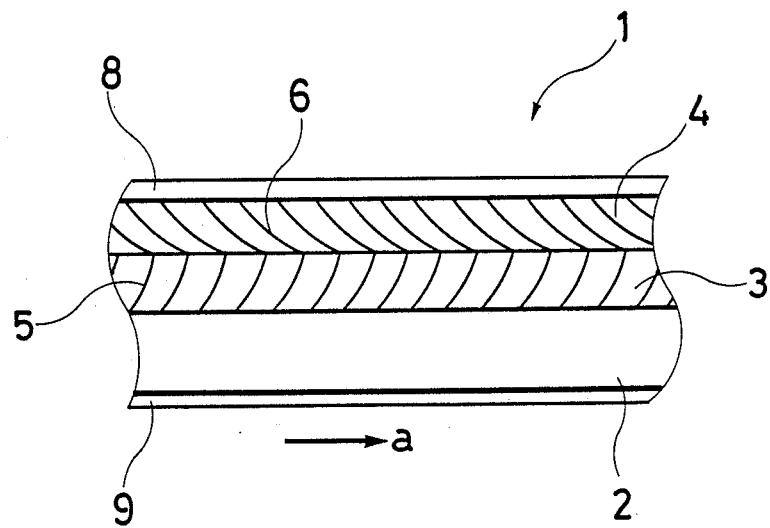
FIG. 1 is a schematic longitudinal cross-section of a magnetic recording medium according to one embodiment of the present invention wherein columnar metal particles of the upper layer are inclined opposite to those of the lower layer.
Figure 2:
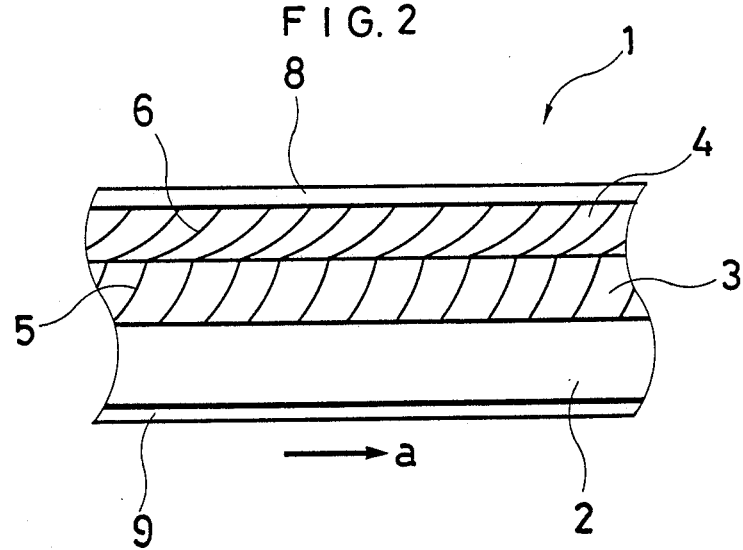
FIG. 2 is a schematic longitudinal cross-section of a magnetic recording medium according to another embodiment of the present invention wherein columnar metal particles of the upper and lower layers are of the same orientation.

In FIGS. 1 and 2, the magnetic recording medium 1 has a ferromagnetic metal thin film lower layer 3 and a ferromagnetic metal thin film upper layer 4 on a substrate 2. The orientation of inclined particles 5 in the lower layer 3 with respect to a normal to the substrate major surface and the orientation of inclined particles 6 in the upper layer 4 with respect to a normal to the substrate major surface are opposite in FIG. 1 and the same in FIG. 2 as viewed in a longitudinal direction a of the substrate, which also indicates the direction of movement of the medium during recording/reproducing operation.

In the ferromagnetic metal thin film according to the present invention, inclined columnar particles may be oriented either opposite or identically in two or more layers. Preferably, inclined columnar particles are oriented opposite in two adjoining layers as shown in FIG. 1.

It is to be noted that oxygen is present in the form of oxides on the surface of columnar particles near the upper surface of each layer. The gradient of oxygen concentration in the ferromagnetic metal thin film is not particularly limited. Since the ferromagnetic metal thin film is of a multi-layered structure having at least two layers, the columnar particles may be of a relatively reduced length, which contributes to the increased strength of the entire ferromagnetic metal thin film. The columnar particles preferably have a breadth of about 50 to 500 Å.

The oxygen concentration of the uppermost layer is higher than that of the lowermost layer. Then such signals having a relatively shallow magnetic field and a relatively high central frequency of about 5 MHz are effectively held in the uppermost layer having a higher coercive force Hc than the lowermost layer, providing an excellent resolution. This tendency is enhanced particularly when columnar particles in the relatively thin uppermost layer are inclined at an angle of 20° to 90°, especially at least 50° with respect to a normal to the substrate major surface.

Conversely, such signals having a relatively deep magnetic field and a central frequency of about 0.75 MHz are effectively held in the lowermost layer having a higher maximum residual magnetic flux $\phi r$ and higher squareness ratio than the uppermost layer, providing an excellent electromagnetic properties. This tendency is enhanced particularly when columnar particles in the relatively thick lowermost layer are inclined at an angle of at most 50° with respect to a normal to the substrate major surface, that is, approximately upright to the substrate major surface.

Since the uppermost layer has a relatively high oxygen concentration, the oxides of cobalt and nickel having high abrasion resistance are formed on the uppermost layer, which contributes to the increased strength of the ferromagnetic metal thin film as a synergistic effect with the multilayered structure.

If desired, a nonmagnetic metal thin film layer may be interposed between the uppermost and lowermost layers of the ferromagnetic metal thin film.

The most common process for forming the magnetic thin film is an oblique evaporation technique among many other vapor phase plating techniques. The standard oblique evaporation technique also known as deposition method of continuously varied incidence may be employed wherein the incident angle of depositing metal with respect to a normal to the substrate is continuously varied. The minimum incident angle is not particularly limited in the broadest scope. Preferably, the minimum incident angle is set at most 50° during deposition of the lowermost layer, between 20° and 90° during deposition of the uppermost layer, and between 20° and 50° during deposition of an intermediate layer if any for three or more layer structures. The improvements in electromagnetic properties are less desirable at a minimum incident angle outside the above-defined ranges.

Two or more layers may be formed in a single continuous step, but usually, they are formed in separate evaporation steps. By separately forming two or more magnetic layers in two or more evaporation steps, the orientation of obliquely grown columnar particles with respect to a normal to the substrate major surface can be opposite between two adjoining layers in a longitudinal direction of the substrate. The magnetic layer structure having at least two layers containing opposite oriented columnar particles exhibits more improved electromagnetic properties.

The atmosphere for evaporation may be an inert atmosphere of argon, helium or vacuum which contains oxygen gas and is set to a pressure of about $10^{-5}$ to $10^0$ Pa. Other parameters may be as usual or determined without undue experimentation, including source-to-substrate distance, substrate carrying direction, and the structure and arrangement of the can and mask.

Evaporation in an oxygen-containing atmosphere results in formation of a metal oxide coating on the surface. The partial pressure of oxygen at which such metal oxide is formed may be readily determined through experimentation.

A metal oxide coating may be formed on the surface of the magnetic layer by an oxidizing treatment. Any of the following oxidizing treatments may be employed for this purpose.

(1) Dry treatment
  (a) Energy particle treatment: Oxygen may be directed as energy particles to the magnetic layer at the final stage of evaporation process by means of an ion gun or neutron gun as described in Japanese Patent Application No. 58-76640.
  (b) Glow treatment: The magnetic layer is exposed to a plasma which is created by generating a glow discharge in an atmosphere containing $O_2$, $H_2O$ or $O_2 + H_2O$ in combination with an inert gas such as Ar and $N_2$.

(c) Oxidizing gas: An oxidizing gas such as ozone and steam is blown to the magnetic layer.

(d) Heat treatment: Oxidation is effected by heating at temperatures of about 60° to 150° C.

(2) Wet Treatment (a) Anodization (b) Alkali treatment (c) Acid treatment: Chromate treatment, permanganate treatment, phosphate treatment (d) Oxidant treatment: $H_2O_2$ Substrate The material of which the substrate of the magnetic recording medium according to the present invention is made is not particularly limited as long as it is a non-magnetic plastic material. Generally, preferred non-limiting examples of the substrate materials are polyesters such as poly(ethylene terephthalate) and poly(ethylene-2,6-naphthalate), polyamides, polyimides, polyphenylene sulfide, polysulfones, all aromatic polyesters, polyether ether ketones, polyethersulfones, and polyetherimides. In the broadest scope, no particular limit is imposed on the shape and dimensions (width, length, thickness) of the substrate as long as it meets the intended application.

Preferably, the thickness of the substrate is at most 20 μm, more preferably at most 8 μm, most preferably from about 5 to 7 μm. A thickness in excess of 8 μm is less desirable for the purposes of compactness and extended recording. Too thin substrates are weak and offset the improved film strength of the magnetic layer due to multi-layered structure, incurring problems of poor runnability, output drop, and head wear.

The improvement in electromagnetic properties due to the multi-layered structure of the ferromagnetic metal thin film according to the present invention becomes more outstanding when the substrate is relatively thin, at most 8 μm. For example, when the substrate is 10 μm thick, there are observed electromagnetic property improvements of about +6 dB for signals in the low frequency region of 0.75 MHz and +6 dB for signals in the high frequency region of 5 MHz by changing the ferromagnetic metal thin film from the prior art mono-layer structure to the double-layer structure according to the present invention. When the thickness of the substrate is reduced to 7 μm, the improvement for signals in the low frequency region of 0.75 MHz is at the same level of about +6 dB as achieved with the 10 μm substrate, but that for signals in the high frequency region of 5 MHz is increased to about +7.5 dB. By substituting the multi-layer structure for the single layer structure, electromagnetic properties are more improved with the 7 μm substrate than with the 10 μm substrate because the multi-layered structure of the magnetic layer of the present invention compensates for and surpasses a loss of stiffness due to thickness reduction from 10 μm to 7 μm which otherwise adversely affects head contact particularly at the high frequency region of 5 MHz.

Any desired one or both major surfaces of the substrate may be subjected to any desired pretreatment including a plasma treatment.

Plasma-polymerized film

The magnetic recording medium of the present invention may be further provided with a plasma polymerized film between the lowermost layer of the ferromagnetic metal thin film and the substrate, or between any two adjoining layers of the ferromagnetic metal thin film, or on the surface of the uppermost layer of the ferromagnetic metal thin film remote from the substrate.

Figure 3:
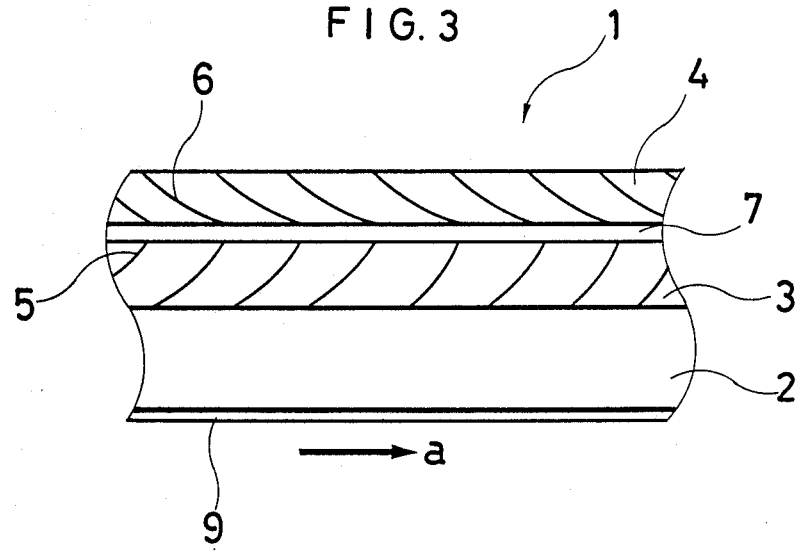
FIG. 3 is an illustration similar to FIG. 1, except that a plasma-polymerized interlayer intervenes between the upper and lower layers.
Figure 4:
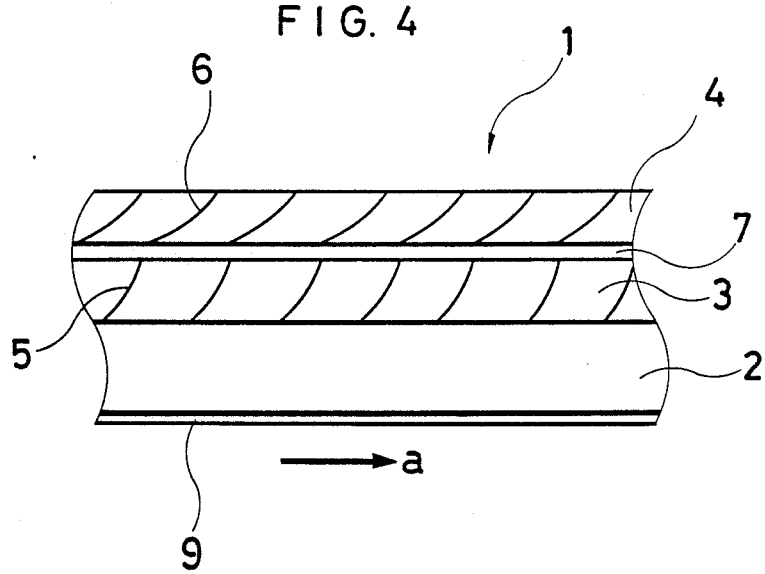
FIG. 4 is an illustration similar to FIG. 2, except that a plasma-polymerized interlayer intervenes between the upper and lower layers.

FIGS. 3 and 4 illustrate typical embodiments of the two layer structure magnetic film wherein a plasma polymerized interlayer 7 is disposed between the lower layer 3 and the upper layer 4 of the ferromagnetic metal thin film. The elements other than interlayer 7 are the same as in FIGS. 1 and 2.

The plasma polymerized film or interlayer is preferably a thin film comprised of carbon and hydrogen.

A source material used in plasma polymerization to form the plasma polymerized film is a gaseous reactant. The gaseous reactant used is generally at least one reactant selected from hydrocarbons which are gaseous at room temperature, such as methane, ethane, propane, butane, pentane, ethylene, propylene, butene, butadiene, acetylene, methylacetylene, and other saturated and unsaturated hydrocarbons, and mixtures thereof. Those hydrocarbons which are liquid at room temperature may also be used as the reactant if desired. Another preferred source material is a mixture of such a hydrocarbon or hydrocarbons with at least one inorganic gas such as $H_2$, $O_2$, $O_3$, $H_2O$, $N_2$, $NO_x$ including NO, $N_2O$, $NO_2$, etc., $NH_3$, CO, and $CO_2$. Further, the source material may optionally contain a minor proportion of a material containing Si, B, P, S or a similar trace element.

The plasma-polymerized film is formed from such a reactant or reactant mixture to a thickness of 3 to 80 Å. A thicker plasma-polymerized film in excess of 80 Å creates an increased spacing loss. Films thinner than 3 Å are ineffective for the purpose of the present invention. It is to be noted that film thickness may be measured by means of an ellipsometer, for example. The plasma-polymerized film may be formed to any desired thickness by controlling such factors as reaction time and reactant gas flow rate during film formation.

The plasma polymerized film may be formed on a subject by exposing the subject to a discharge plasma of the reactant or reactants.

The principle of plasma polymerization is as described above. The present invention utilizes the plasma phenomenon to form a plasma polymerized interlayer on the ferromagnetic metal thin film lower layer, for example. The utilization of a low temperature plasma avoids any thermal influence on the substrate and any layer formed thereon.

There may be used an apparatus for forming a plasma polymerized film on the surface of a subject as shown in FIG. 6. In the plasma polymerization, the plasma may be created by a microwave discharge, DC discharge and AC discharge as well as radio frequency discharge.

The plasma-polymerized film is prepared by feeding a gaseous monomer into a plasma zone with W/(F.M) set to at least $10^7$ joule/kg where W is an input power applied for plasma generation as expressed in joule/sec., F is a flow rate of the monomer as expressed in kg/sec., and M is the molecular weight of the monomer. If W/F.M is less than $10^7$, the resulting plasma-polymerized film is insufficiently dense for its purpose. The upper limit of W/F.M is generally about $10^{15}$ joule/kg.

The plasma polymerized film thus formed preferably contains C or C and at least one element selected from H, N and O as previously described. The content of C may preferably range from 30 to 100 atom percents, more preferably from 30 to 80 atom percents of the plasma polymerized film. A plasma polymerized film having a carbon content of less than 30 atom % has a reduced film strength below the acceptable level. Preferably, the atomic ratio of carbon to hydrogen (C/H) is from 1:1 to 6:1 because the film exhibits improved corrosion resistance and durability in this range. When nitrogen is also contained, the atomic ratio of carbon to nitrogen (C/N) is from 1:1 to 6:1. With C/N of less than 1, corrosion resistance, durability and strength are undesirably low. With C/N of more than 6, an increased output drop is observed after a durability test. The plasma-polymerized film may further contain O, Si, B, P, and/or S in an amount of less than 20 atom %.

The contents of C, H, and other elements contained in the plasma polymerized film may be determined by secondary ion mass spectroscopy (SIMS). Since the plasma polymerized film used in the practice of the present invention is 3 to 80 Å thick, the contents of C, H, and other elements may be calculated by counting the respective elements on the film surface by SIMS. The measurement of SIMS may be in accord with the article "SIMS and LAMMA" in the Surface Science Basic Lectures, Vol. 3, 1984 (Tokyo), Elementary and Application of Surface Analysis, page 70. Alternatively, the contents of C, H, and other elements may be calculated by determining the profile of the respective elements while effecting ion etching with Ar or the like.

The plasma polymerized film is preferably formed on a plasma pre-treated surface of the substrate or lower or upper layer of the ferromagnetic metal thin film. The underlying surface becomes more adherent by treating it with a plasma so that the adherence between the underlying and a subsequently applied ferromagnetic thin film is eventually improved.

The plasma treatment of the underlying surface may be effected by substantially the same process as previously described for the plasma polymerization with respect to its principle, operation, and conditions. The difference is that an inorganic gas is used as the treating gas in the plasma treatment whereas the formation of a plasma polymerized film by plasma polymerization uses an organic gas optionally containing an inorganic gas as the reactant gas.

The treating gas employed in the plasma treatment of the underlying surface is not particularly limited. Any inorganic gases may be used for the purpose, for example, $H_2$, Ar, He, $N_2$, $O_2$, and air. Preferred among them is an inorganic gas containing at least one of O, N, and H. The preferred inorganic gas may be selected from $H_2$, $O_2$, $O_3$, $H_2O$, $N_2$, $NH_3$, $NO_x$ including NO, $N_2O$ and $NO_2$, etc. They may be used alone or in admixture with a rare gas such as argon, helium and neon.

The type of the electric source used for the plasma treatment is not particularly limited, and DC, AC, and microwave sources may be used. In this plasma treatment, the preferred power source has a frequency in the range of 10 to 200 kilohertz. With a plasma treatment at a frequency of 10 to 200 KHz, durability and bond strength are markedly increased.

The provision of a plasma-polymerized film or interlayer as described above significantly improves the durability, abrasion resistance, weatherability, and corrosion resistance of the medium.

Referring to FIGS. 1 to 4 again, the magnetic recording medium 1 having a magnetic layer 3, 4 in the form of a multi-layered ferromagnetic metal thin film as previously described may preferably provided with a topcoat layer 8 and/or a backcoat layer 9 irrespective of whether or not the plasma-polymerized interlayer 7 is present in the magnetic layer.

In one preferred embodiment, the plastic substrate may be provided on its surface opposite to the magnetic layer with a backcoat layer with or without an undercoat layer.

The undercoat layer may be either a thin film of a single metal selected from Al, Cu, W, Mo, Cr, and Ti or a thin film of an alloy of any of such metals or oxides of such metals. The undercoat layer may have a thickness of 0.05 to 1.5 μm.

Backcoat

The backcoat layer may be formed by applying a composition comprising a pigment and a binder, typically a radiation-curable compound on the substrate rear surface with or without the undercoat layer.

Some illustrative non-limiting examples of the pigments used in the backcoat composition includes (1) electroconductive pigments such as carbon black, graphite, and graphitized carbon black; and (2) inorganic fillers such as $SiO_2$, $TiO_2$, $Al_2O_3$, $Cr_2O_3$, SiC, Cao, $CaCo_3$, zinc oxide, geothite, $\alpha$-$Fe_2O_3$, talc, kaolin, $CaSO_4$, boron nitride, graphite fluoride, molybdenum disulfide, and ZnS. Preferred are calcium carbonate, kaolin, zinc oxide, zinc sulfide, goethite, and carbon.

These inorganic pigments may be used in amounts of about 20 to 200 parts by weight of (1) and 10 to 300 parts by weight of (2) per 100 parts by weight of the binder. The use of the inorganic pigments in excess amounts results in a brittle coating which produces more dropouts.

The inorganic pigments may preferably have an average diameter of 0.01 to 0.3 μm, more preferably 0.02 to 0.1 μm.

The radiation curable resins used as the binder in the backcoat composition may preferably be selected from vinyl chloride-vinyl acetate-vinyl alcohol copolymers (which may have carboxylic units incorporated therein), acryl-modified vinyl chloride-vinyl acetate-vinyl alcohol copolymers (which may have carboxylic units incorporated therein), urethane acrylates, and the like. Also contemplated are those thermoplastic resins having contained or incorporated in their molecule radicals susceptible to crosslinking or polymerization upon exposure to radiation, for example, acrylic double bonds as given by acrylic and methacrylic acids having an unsaturated double bond capable of radical polymerization or esters thereof; allyl double bonds as given by diallyl phthalate; and unsaturated bonds as given by maleic acid and maleic derivatives.

Monomers which can be used as the polymer component in the practice of the present invention include acrylic acid, methacrylic acid, and acrylamide.

Those polymers having a double bond may be obtained by modifying various polyesters, polyols, polyurethanes and analogues with compounds having an acrylic double bond. If desired, polyhydric alcohols or polyfunctional carboxylic acids may be blended to obtain compounds having varying molecular weights.

The foregoing examples are only a few of the radiation sensitive resins used herein. They may also be used alone or in admixture.

The preferred organic binder in the backcoat layer is a composition comprising (A) 20 to 70% by weight of a plastic compound having at least two radiation-curable unsaturated double bonds and a molecular weight of 5,000 to 100,000, (B) 20 to 80% by weight of a rubber-like compound having at least one radiation-curable unsaturated double bond or not being radiation curable and having a molecular weight of 3,000 to 100,000, and (C) 10 to 40% by weight of a compound having at least one radiation-curable unsaturated double bond and a molecular weight of 200 to 3,000.

The use of the radiation-curable compounds increases the breakage strength of the composition. The resulting reinforced backcoat layer undergoes little abrasion and prevents inorganic filler particulates from migrating from the backcoat to the magnetic layer, resulting in reduced dropouts. A roll of the magnetic recording medium being taken up during manufacture is no longer tightened during curing process so that the medium has uniform properties in a lengthwise direction.

If a thermosetting organic binder is used in the manufacture of the magnetic recording medium of the present invention, the lubricant in the backcoat can be transferred to the magnetic thin film during manufacturing process, resulting in many disadvantages including unstable movement of the medium in service accompanied by an output reduction or even image signal loss, rather high friction, and separation or breakage of the ferromagnetic thin film due to backward morphology transfer. These problems may be overcome by first applying the topcoat while there often occurs another problem that the medium as topcoated is susceptible to damage during the process. Further, in the case of thermosetting type, the back-to-top morphology transfer caused by tightening of a jumbo roll of coated medium during thermosetting process gives rise to a difference in electromagnetic properties between outer and inner coils of the roll.

On the contrary, radiation-curable resins can be continuously cured within a relatively short time during manufacturing process, thus completely eliminating the back-to-top morphology transfer and hence, minimizing dropouts. The steps of applying and curing the topcoat can be performed on-line in the manufacturing process, contributing to cost reduction through energy consumption and labor savings. Advantages in quality are also achieved by reducing the dropout in a magnetic tape which is otherwise remarkable due to tightening during curing, and eliminating an output difference of the magnetic tape in a lengthwise direction due to the difference in stress between outer and inner coils of a roll of tape.

The components (A), (B), and (C) used in the backcoat binder according to the invention should contain per molecule at least 2, and preferably at least 5 unsaturated double bonds for (A), at least 1, and preferably at least 5 unsaturated double bonds for (B), and at least 1, and preferably at least 3 unsaturated double bonds for (C).

The plastic compounds used as (A) in the practice of the present invention are those having in its molecular chain at least two unsaturated double bonds capable of generating radicals upon exposure to radiation to yield a crosslinked structure. They may be obtained by modifying thermoplastic resins to be radiation sensitive.

Exemplary of the radiation-curable resins are those resins having contained or incorporated in their molecule radicals susceptible to crosslinking or polymerization upon exposure to radiation, for example, acrylic double bonds as given by acrylic and methacrylic acids having an unsaturated double bond capable of radical polymerization or esters thereof; allyl double bonds as given by diallyl phthalate; and unsaturated bonds as given by maleic acid and maleic derivatives. Also included are compounds having an unsaturated double bond capable of giving rise to crosslinking or polymerization upon exposure to radiation. They preferably have a molecular weight of 5,000 to 100,000, more preferably 10,000 to 80,000.

Typical of the resins in the form of thermoplastic resins having contained in their molecule groups capable of crosslinking or polymerizing upon exposure to radiation are unsaturated polyester resins. Included are polyester resins having radiation-sensitive unsaturated double bonds in their molecular chain, for example, unsaturated polyester resins which may be prepared by a standard process of esterifying polybasic acids and polyhydric alcohols into saturated polyester resins (2) as will be described below except that the polybasic acids are partially replaced by maleic acid so that the resulting polyesters may have radiation-sensitive unsaturated double bonds.

The radiation-curable unsaturated polyester resins may be prepared by adding maleic acid or fumaric acid to at least one polybasic acid and at least one polyhydric alcohol, conducting dewatering or alcohol-removing reaction in a conventional manner, that is, in a nitrogen atmosphere at 180° to 200° C. in the presence of a catalyst, raising the temperature to 240° to 280° C., and conducting condensation reaction at the temperature under a vacuum of 0.5 to 1 mmHg. The amount of maleic or fumaric acid added may be 1 to 40 mol %, and preferably 10 to 30 mol % of the acid reactant in consideration of crosslinking and radiation curing properties during preparation.

Examples of the thermoplastic resins which can be modified into radiation-curable resins will be described below.

(1) Vinyl chloride copolymers

Included are vinyl chloride-vinyl acetate-vinyl alcohol copolymers, vinyl chloride-vinyl alcohol copolymers, vinyl chloride-vinyl alcohol-vinyl propionate copolymers, vinyl chloride-vinyl acetate-maleic acid copolymers, vinyl chloride-vinyl acetate-OH terminated, alkyl branched copolymers, for example, VROH, VYNC, VYEGX, VERR, VYES, VMCA, and VAGH (all trade names, manufactured by U.C.C.), and analogues. These copolymers may be modified to be radiation sensitive by incorporating acrylic, maleic, or allyl double bonds.

(2) Saturated polyester resins

Included are saturated polyesters obtained by esterifying saturated polybasic acids such as phthalic acid, isophthalic acid, terephthalic acid, succinic acid, aidpic acid, sebasic acid, etc. with polyhydric alcohols such as ethylene glycol, diethylene glycol, glycerine, trimethylolpropane, 1,2-propylene glycol, 1,3-butanediol, dipropylene glycol, 1,4-butanediol, 1,6-hexanediol, pentaerithritol, sorbitol, neopentyl glycol, 1,4-cyclohexanedimethanol, etc., and products obtained by modifying these resins with $SO_3Na$ or the like, for example, Vyron 53S (trade name, Toyobo K.K.). They may be modified to be radiation sensitive.

(3) Polyvinyl alcohol resins

Included are polyvinyl alcohol, butyral resins, acetal resins, formal resins, and copolymers of such units. They may be modified to be radiation sensitive by acting on a hydroxyl group in them.

(4) Epoxy resins and phenoxy resins

Included are epoxy resins formed by reaction of bisphenol-A with epichlorohydrin and methyl epichlorohydrin, for example, Epicoat 152, 154, 828, 1001, 1004, and 1007 (trade names, manufactured by Shell Chemicals), DEN 431, DER 732, DER 511 and DER 331 (trade names, manufactured by Dow Chemicals), Epichlon 400 and 800 (trade names, manufactured by Dai-Nihon Ink K.K.); phenoxy resins which are epoxy resins having a high degree of polymerization, for example, PKHA, PKHC, and PKHH (trade names, manufactured by U.C.C.); and copolymers of brominated bisphenol-A with epichlorohydrin, for example, Epichlon 145, 152, 153, and 1120 (trade names, manufactured by Dai-Nihon Ink K.K.). These resins may be modified to be radiation sensitive by using an epoxy group contained therein.

(5) Cellulosic derivatives

A variety of cellulosic derivatives may be used although nitrocellulose, cellulose acetobutyrate, ethyl cellulose, butyl cellulose, acetyl cellulose, and analogues are preferred. These resins may be modified to be radiation sensitive by using a hydroxyl group contained therein.

Additional examples of the resins which can be subjected to radiation sensitive modification include polyfunctional polyester resins, polyether-ester resins, polyvinyl pyrrolidone resins and derivatives (e.g., PVP-olefin copolymers), polyamide resins, polyimide resins, phenol resins, spiro-acetal resins, and acrylic resins containing at least one of hydroxyl-containing acrylates and methacrylates as a polymer component.

The high molecular weight compounds used as (B) in the practice of the present invention are thermoplastic elastomers or prepolymers, or thermoplastic elastomers or prepolymers modified to be radiation sensitive, with the latter being preferred.

Examples of the elastomers and prepolymers are presented below.

(i) Polyurethane elastomers and prepolymers

Polyurethanes are very useful because of abrasion resistance and adhesion to substrates, for example, PET films. Illustrative polyurethane elastomers and prepolymers are condensation polymerization products from (a) polyfunctional isocyanates such as 2,4-toluenediisocyanate, 2,6-toluenediisocyanate, 1,3-xylenediisocyanate, 1,4-xylenediisocyanate, 1,5-naphthalenediisocyanate, m-phenylenediisocyanate, p-phenylenediisocyanate, 3,3'-dimethyl-4,4'-diphenylmethane diisocyanate, 4,4'-diphenylmethane diisocyanate, 3,3'-dimethylbiphenylene diisocyanate, 4,4'-biphenylene diisocyanate, hexamethylene diisocyanate, isophorone diisocyanate, dicyclohexylmethane diisocyanate, Desmodur L, Desmodur N (trade names, manufactured by Farbenfabriken Bayer A.G.), etc.; and (b) linear saturated polyesters as produced through polycondensation from polyhydric alcohols (such as ethylene glycol, diethylene glycol, glycerine, trimethylol propane, 1,4-butanediol, 1,6-hexanediol, pentaerythritol, sorbitol, neopentylglycol, 1,4-cyclohexanedimethylol, etc.) and saturated polybasic acids (such as phthalic acid, isophthalic acid, terephthalic acid, succinic acid, adipic acid, sebasic acid, etc.); linear saturated polyethers such as polyethylene glycol, polypropylene glycol, and polytetramethylene glycol; caprolactam; polyesters such as hydroxyl-containing acrylates and hydroxyl-containing methacrylates, and the like. It is very useful to react the isocyanate or hydroxyl terminal group of these urethane elastomers with a monomer having an acrylic or allyl double bond to modify them to be radiation sensitive.

(ii) Acrylonitrile-butadiene copolymerized elastomers

Acrylonitrile-butadiene copolymerized prepolymers having a hydroxyl terminal group commercially available as Poly BD Liquid Resin from Sinclair Petro-Chemical and elastomers commercially available as Hiker 1432J from Nihon Zeon K.K. are adequate because the double bond of a butadiene unit is capable of generating a radical upon exposure to radiation to facilitate crosslinking and polymerization.

(iii) Polybutadiene elastomer

Low molecular weight prepolymers having a hydroxyl terminal group commercially available as Poly BD Liquid Resin R-15 from Sinclair Petro-Chemical and the like are preferred because they are compatible with thermoplastic resins. R-15 prepolymers whose molecule is terminated with a hydroxyl group can be more radiation sensitive by adding an acrylic unsaturated double bond to the molecule end, which is more advantageous as a binder component.

Also, cyclic products of polybutadienes commercially available as CBR-M901 from Nihon Synthetic Rubber K.K. offer satisfactory quality when combined with thermoplastic resins.

Additional preferred examples of the thermoplastic elastomers and prepolymers include styrene-butadiene rubbers, chlorinated rubbers, acrylic rubbers, isoprene rubbers, and cyclic products thereof (commercially available as CIR 701 from Nihon Synthetic Rubber K.K.) while elastomers, for example, epoxy-modified rubbers and internally plasticized, saturated linear polyesters (commercially available as Vyron #300 from Toyobo K.K.) may also be useful provided that they are subjected to radiation sensitive modification.

The radiation-curable compounds having an unsaturated double bond which may be used as (C) in the present invention include styrene, ethyl acrylate, ethylene glycol diacrylate, ethylene glycol dimethacrylate, diethylene glycol acrylate, diethylene glycol dimethacrylate, 1,6-hexaneglycol diacrylate, 1,6-hexaneglycol dimethacrylate, trimethylolpropane triacrylate, trimethylolpropane trimethacylate, polyfunctional oligoester acrylates (e.g., Aronix M-7100 available from Toa Synthetic K.K.), acryl modified products of urethane elastomers (e.g., Nippolane 4040 available from Nippon Polyurethane K.K.), and derivatives thereof having a functional group such as COOH incorporated therein.

Among known polymers, polymers of one type degrade while polymers of another type give rise to crosslinking between molecules upon exposure to radiation.

Included in the crosslinking type are polyethylene, polypropylene, polystyrene, polyacrylate, polyacrylamide, polyvinyl chloride, polyester, polyvinyl pyrrolidone rubber, polyvinyl alcohol, and polyacrolein. Since these polymers of the crosslinking type give rise to crosslinking reaction without any particular modification as previously described, they may also be used as the radiation-curable binder as well as the above-mentioned modified products. The polymers of the crosslinking type can be cured within a short time even when used in solventless form. The use of polymers of this type is thus very useful as the backcoat resin.

Particularly preferred for the radiation curable resin composition used in the backcoat according to the invention are combinations of component (A) selected from partially saponified vinyl chloride-vinyl acetate copolymers, vinyl chloride-vinyl acetate copolymers having carboxylic units incorporated therein, and compounds prepared by reacting isocyanate-bearing compounds resulting from reaction between phenoxy resins and polyisocyanate compounds with acrylic or methacrylic compounds having a functional group capable of reacting with the isocyanate group, component (B) selected from compounds prepared by reacting isocyanate compounds or polyols (polyurethane elastomers) resulting from reaction between polyols and isocyanates with acrylic or methacrylic compounds having a reactive functional group, component (C) selected from polyfunctional acrylate or methacrylate monomers, oligoester acrylates, and low molecular weight compounds of (B).

These compounds may be used alone or in admixture of two or more.

The backcoat layer preferably has a thickness of about 0.2 to 2.5 $\mu$m, more preferably about 0.3 to 1.5 $\mu$m. A sufficient level of stability is not reached during operation when the backcoat is thinner than 0.2 $\mu$m. Backcoat layers of thicker than 2.5 $\mu$m undergo considerable removal due to abrasion.

In addition to the pigment and organic binder described above, the backcoat composition may further contain any of various well-known additives including lubricants.

A non-reactive solvent may optionally be used as a coating aid in the practice of the present invention. A suitable solvent may be chosen by taking into account the solubility of and compatibility with the binder. Some illustrative non-limiting examples of the non-reactive solvents include ketones such as methyl ethyl ketone (MEK), methyl isobutyl ketone (MIBK), cyclohexanone; alcohols such as isopropyl alcohol (IPA); aromatic hydrocarbons such as toluene; and halohydrocarbons such as dichloroethane, alone or in admixture.

The lubricants used herein and also serving as dispersants include well-known lubricants commonly used in magnetic recording media of the type, for example, fatty acids and fatty acid salts. Some illustrative non-limiting examples include fatty acids containing at least 12 carbon atoms represented by RCOOH wherein R is an alkyl group having at least 11 carbon atoms, for example, caprylic, capric, lauric, myristic, palmitic, stearic, behenic, oleic, elaidic, linolic, linoleic, and stearolic acid, and metal soaps of the afore-mentioned fatty acids with alkali metals (e.g. Li, Na, K) and alkaline earth metals (e.g. Mg, Ca, Ba), and lecithin.

Also included are higher alcohols having at least 12 carbon atoms and sulfate esters thereof, surface active agents, titanium coupling agents, and silane coupling agents.

The lubricant (dispersant) is added in an amount of 1 to 20 parts by weight per 100 parts by weight of the binder.

Other examples of the useful lubricants include silicone oil, graphite, molybdenum disulfide, tungsten disulfide, esters of monobasic fatty acids having 12 to 16 carbon atoms with monohydric alcohols having 3 to 12 carbon atoms, and esters of monobasic fatty acids having at least 17 carbon atoms with monohydric alcohols wherein the total number of carbon atoms ranges from 21 to 23. These lubricants (dispersant) may be added in an amount of 0.2 to 20 parts by weight per 100 parts by weight of the binder.

Any other additives may be added which are known to be useful as the backcoat.

For example, antistatic agents may be added including natural surface-active agents such as saponin; nonionic surface-active agents such as alkylene oxides, glycerins, glycidols; cationic surface-active agents such as higher alkyl amines, quaternary ammonium salts, heterocyclic compounds (e.g. pyridine), phosphoniums and sulfoniums; anionic surface-active agents containing an acidic radical such as carboxylic acid, sulfonic acid, phosphoric acid, sulfate ester radicals, and phosphate ester radicals; and amphoteric surface active agents such as amino acids, aminosulfonic acids, sulfates and phosphates of amino alcohols.

The lubricant and antioxidant agents used in the backcoat and topcoat (described later) compositions according to the present invention are preferably of radiation curable type.

These radiation-curable resins may be cured by any of various well-known methods. Active energy radiation used for crosslinking may include electron radiation from a radiation source in the form of a radiation accelerator, $\gamma$-ray emitted from Co60, $\beta$-ray emitted from Sr90, X-ray emitted from an X-ray generator, and ultraviolet radiation. Particularly preferred types of radiation for exposure include radiation generated by a radiation accelerator because of ease of control of a dose, simple incorporation in a manufacturing line, and electromagnetic radiation shielding. In curing the backcoat and topcoat (described later) layers through exposure to radiation, it is preferred to operate a radiation accelerator at an accelerating voltage of 100 to 750 kV, more preferably 150 to 300 kV to generate radiation having a sufficient penetrating power such that the object is exposed to a radiation dose of 0.5 to 20 megarad. In the practice of radiation curing according to the present invention, it is very advantageous to use a low dose type radiation accelerator (electrocurtain system) available from Energy Science Inc. of U.S.A. because it may be readily incorporated in a tape coating and fabricating line and internal shielding of secondary x-rays is complete. A van de Graaff type accelerator may equally be employed which has been duly used as a radiation accelerator in the prior art.

It is important in radiation crosslinking to expose the backcoat or topcoat layer to radiation in a stream of an inert gas such as nitrogen and helium. Exposure to radiation in air is not desirable because $O_3$ generated by radiation exposure acts on the binder polymer to generate radicals therein which in turn, adversely affect the crosslinking reaction of the binder. It is thus important that the atmosphere where active energy radiation is irradiated be an atmosphere of an inert gas such as $N_2$, He, and $CO_2$ having an oxygen concentration of 5% at the maximum.

The surface of the substrate or undercoat (if any) on which the backcoat layer is formed may preferably be treated with a plasma for the purpose of increasing bond strength. Such plasma treatment may be carried out using an inorganic gas as a treating gas, preferably an inorganic gas containing O, N and/or H. The frequency of plasma treatment is not particularly limited, but better results are obtained when the plasma treatment is carried out at a frequency of 10 KHz to 200 KHz.

The plasma treatment significantly increases the bond strength between the substrate or undercoat and the backcoat. It is also feasible to carry out a plasma treatment on the substrate before the undercoat is formed thereon.

Topcoat

In a further preferred embodiment, the magnetic recording medium of the present invention may have a topcoat layer 8 on the magnetic layer 3, 4 as shown in FIGS. 1 and 2.

Preferably, the topcoat layer has a composition comprising a fatty acid ester and a compound containing a group having a radiation sensitive unsaturated double bond and a fluoro-substituted alkyl group.

The fatty acid esters contained in the topcoat preferably have a melting point of from $-20°$ C. to $30°$ C., more preferably from $-10°$ C. to $25°$ C. Esters having a melting point of lower than $-20°$ C. do not well lubricate at elevated temperatures, for example, cause clogging and adhesion to the head at $40°$ C. Esters having a melting point of higher than $30°$ C. do not well lubricate at lower temperatures for example, cause adhesion to a cylinder (head) or squeaky noise at $0°$ C.

Examples of the fatty acid esters having a melting point in the above-defined range include esters of monobasic fatty acids having 4 to 24 carbon atoms such as caprilic acid, lauric acid, myristic acid, palmitic acid, stearic acid, and arachic acid with monohydric saturated alcohols having 1 to 12 carbon atoms. Preferred among them are esters of monobasic fatty acids having 6 to 20 carbon atoms with monohydric saturated alcohols, the esters having 7 to 26 carbon atoms in total.

Usually the topcoat layer composition contains individual fatty acid esters, but may contain a mixture of two or more fatty acid esters if desired.

The topcoat layer composition also contains a compound containing a group having a radiation sensitive unsaturated double bond and a fluoro-substituted alkyl group.

The preferred groups having a radiation sensitive unsaturated double bond are groups having the formula: $CH_2=CR^2-CO-$ wherein $R^2$ is hydrogen atom or an alkyl group.

The preferred fluoro-substituted alkyl groups are alkyl groups containing 2 to 20 carbon atoms and having a plurality of hydrogen atoms replaced by fluorine atoms. More preferably, the fluoro-substituted alkyl groups are those groups represented by $C_nF_{2n+1}-$ wherein n is an integer having a value from 2 to 20.

The preferred compounds are compounds having the general formula (I):

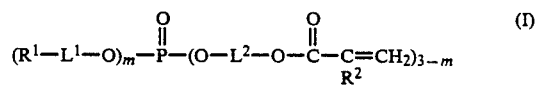

and compounds having the general formula (II):

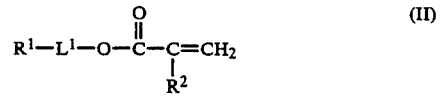

wherein $R^1$ is a fluoro-substituted alkyl group, $R^2$ is hydrogen atom or an alkyl group, $L^1$ and $L^2$ are independently selected from divalent bridging groups, and m is equal to 1 or 2.

In formulae (I) and (II), preferred groups represented by $R^1$ are fluoro-substituted alkyl groups having 2 to 20 carbon atoms, most preferably groups conforming to $C_nF_{2n+1}-$ wherein n is an integer having a value from 2 to 20, for example, $C_4F_9$, $C_5F_{11}$, $C_6F_{13}$, $C_7F_{15}$, $C_8F_{17}$, $C_9F_{19}$, and $C_{10}F_{21}$.

Preferred divalent bridging groups represented by $L^1$ and $L^2$ are substituted or unsubstituted alkylene groups and arylene groups, groups chemically combined therewith, and groups thereof chemically combined with $-O-$, $-S-$, $-SO_2-$, $-CO-$, $-COO-$, $-OCO-$, substituted or unsubstituted $-NH-$, $-SO_2NH-$, $-NHSO_2-$, $-CONH-$, and $-NHCO-$. Most preferred among them are unsubstituted alkylene groups having 1 to 4 carbon atoms. $L^1$ and $L^2$ may be the same or different. $L^1$ and $L^2$ may be further replaced by another substituent such as an alkyl group, aryl group, hydroxyl group, and even $CH_2=CR^2COO-L^1-$ group.

$R^2$ is hydrogen atom or an alkyl group, preferably having 1 to 3 carbon atoms. Preferably $R^2$ is a hydrogen atom and a methyl group.

Some illustrative, non-limiting examples of the compounds of formulae (I) and (II) are given below.

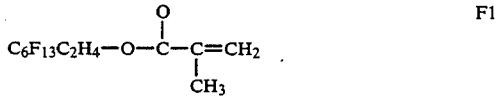
F1

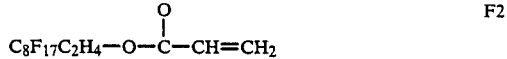
F2

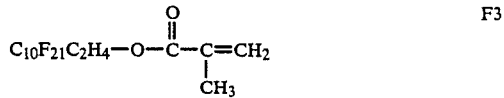
F3

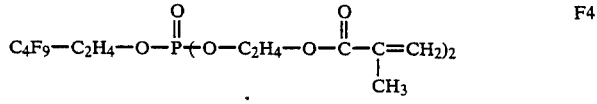
F4

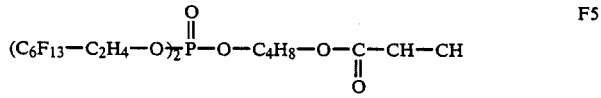
F5

-continued

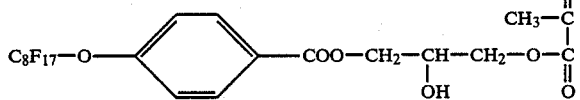
F6

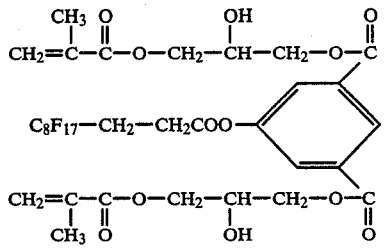
F7

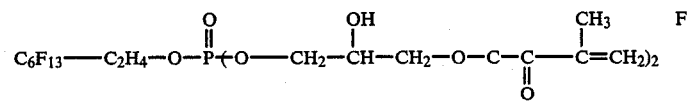
F8

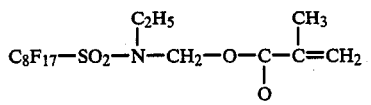
F9

These compounds may be readily prepared by a well-known method.

For instance, compounds of formulae (I) and (II) wherein $R^1$ is $C_nF_{2n+1}$— may be prepared by reacting a halide compound having such a fluorocarbon group, for example, $C_8F_{17}$—$C_2H_4I$ with water to form a corresponding alcohol $C_8F_{17}$—$C_2H_4$—OH. The alcohol is then condensed with an unsaturated acid, for example, acrylic acid in the presence of a strong acid, yielding the desired compound, for example,

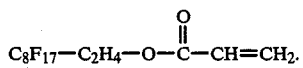

The compounds of formulae (I) and (II) may be individually used or contained in admixture of two or more. In either case, the total amount of the compounds of formulae (I) and (II) contained in the topcoat composition is up to 200 parts by weight, preferably from 2 to 100 parts by weight per 100 parts by weight of the fatty acid ester. Outside this range, the topcoat layers inconveniently give rise to head clogging, head adhesion, increased jitter.

The topcoat layer according to the present invention shows improved adherence or bond to the magnetic layer and hence, improved durability since a compound having a radiation sensitive unsaturated double bond is contained therein. Irradiation of the topcoat layer composition with activating energy radiation to effect crosslinking reaction causes the topcoat layer to be quickly cured and firmly bonded to the magnetic layer, resulting in further enhanced durability. The compound contained in the topcoat layer composition also has a fluoro-substituted alkyl group as exemplified by $C_nF_{2n+1}$— wherein n is an integer from 2 to 20, which contributes to an improvement in the running stability of the medium. If n of the $C_nF_{2n+1}$— moiety of the radiation functional compound exceeds 20, the bonding force of the topcoat layer to the magnetic layer becomes weak.

Compounds having a fluorocarbon moiety wherein n is less than 2 have substantially reduced lubrication.

The topcoat layer according to the present invention, which contains a compound having both a radiation sensitive unsaturated double bond and a fluoro-substituted alkyl group as exemplified by $C_nF_{2n+1}$—, exhibits a drastic improvement in running performance and is substantially free of abrasion or head clogging during operation.

The topcoat layer composition may be applied onto the magnetic layer by any desired conventional techniques, for example, gravure coating, reverse roll coating, air knife coating, and air doctor coating. It is then cured by exposure to activating energy radiation, for example, electron radiation emitted from a radiation accelerator, gamma-ray emitted from a radiation source in the form of Co60, beta-ray emitted from a radiation source in the form of Sr90, X-ray emitted from an X-ray generator, and ultraviolet radiation. The preferred source of radiation is a radiation accelerator because of ease of control of dose, matching with the production line, and shielding of ionized radiation. The preferred dose of radiation ranges from 0.1 to 20 Mrad.

The topcoat composition is usually dispersed or dissolved in a suitable solvent before it is coated on the magnetic layer. The useful solvents for coating include ketones such as methyl ethyl ketone (MEK), cyclohexanone, and methyl isobutyl ketone (MIBK); alcohols such as isopropyl alcohol (IPA); aromatic hydrocarbons such as toluene; and halohydrocarbons such as dichloroethane. The solvents may be used alone or in admixture of two or more.

The topcoat layer composition may further contain any desired well-known additives including lubricants, antioxidants, and hardening agents.

The lubricants used herein include well-known lubricants commonly used in magnetic recording media of the type, for example, silicone oils, fluoride oils, alcohols, fatty acids, paraffins, liquid paraffins, and various surface active agents, with the fatty acids being preferred. Some illustrative non-limiting examples of the fatty acids include fatty acids containing at least 12 carbon atoms represented by RCOOH wherein R is an alkyl group having at least 11 carbon atoms, for example, caprylic acid, capric acid, lauric acid, myristic acid, palmitic acid, stearic acid, behenic acid, oleic acid, elaidic acid, linolic acid, linoleic acid, and stearolic acid.

Silicones used may be those modified with a fatty acid and those partially modified with fluoride. Alcohols used may be higher alcohols. Fluorides used may be those prepared by electrolytic substitution, telomerization and oligomerization processes.

Among other lubricants, radiation-curable lubricants may conveniently be used. The use of such curable lubricants prevents the transfer of the morphology of the front surface to the rear surface adjoined in roll form, affording some advantages of reduced dropouts, minimized difference in output between the outside and inside coils of a roll of tape, and on-line production.

Examples of the radiation-curable lubricants include compounds containing a molecular chain capable of lubrication and an acrylic double bond in their molecule, for example, acrylates, methacrylates, vinyl acetate, acrylic acid amides, vinyl alcohol esters, methyl vinyl alcohol esters, allyl alcohol esters, glycerides, and the like. These lubricants may be represented by the following structural formulae:

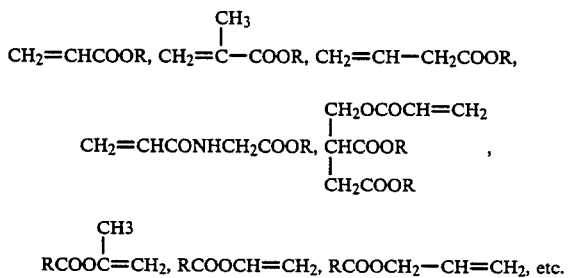

wherein R is a straight or branched, saturated or unsaturated hydrocarbon radical having at least 7 carbon atoms, preferably from 12 to 23 carbon atoms. The radicals represented by R may be fluoro-substituted.

Some preferred examples of these radiation-curable lubricants include stearic acid methacrylate (acrylate), methacrylate (acrylate) of stearyl alcohol, methacrylate (acrylate) of glycerine, methacrylate (acrylate) of glycol, and methacrylate (acrylate) of silicone.

Active energy radiation used for crosslinking may include electron radiation from a radiation source in the form of a radiation accelerator, γ-ray emitted from Co60, β-ray emitted from Sr90, X-ray emitted from an X-ray generator, and ultraviolet radiation. Particularly preferred types of radiation for exposure include radiation generated by a radiation accelerator because of ease of control of a dose, simple incorporation in a manufacturing line, and electromagnetic radiation shielding.

In the practice of the present invention, the topcoat layer preferably has a thickness from 5 to 200 Å. Too thicker layers tend to show deteriorated electromagnetic properties and be abraded away. Too thinner layers cause head clogging. More particularly, since the magnetic layer as uncovered with a topcoat preferably has a surface roughness of up to 100 Å, too thicker topcoats on the magnetic layer are likely to be abraded. Too thinner topcoat layers are weakly adsorbed or bonded by the magnetic layer and thus likely to be separated, causing head clogging. The preferred thickness of the topcoat layer is from 10 to 100 Å.

The topcoat composition used herein may further contain any of commonly used antioxidants, hardeners, and other additives in their ordinary amounts.

The hardening agents used herein include radiation curable monomers and oligomers. The preferred radiation curable monomers are compounds having a molecular weight of less than 2,000, and the preferred radiation curable oligomers are compounds having a molecular weight of 500 to 10,000. They include styrene, ethyl acrylate, ethylene glycol diacrylate, ethylene glycol dimethacrylate, diethylene glycol diacrylate, diethylene glycol dimethacrylate, 1,6-hexaneglycol diacrylate, and 1,6-hexaneglycol dimethacrylate; and more preferably N-vinylpyrrolidone, pentaerythritol tetraacrylate (methacrylate), pentaerythritol triacrylate (methacrylate), trimethylolpropane diacrylate (methacrylate), trimethylolpropane triacrylate (methacylate), polyfunctional oligoester acrylates (e.g., Aronix M-7100, M-5400, 5500, 5700, etc., available from Toa Synthetic K.K.), acryl modified products of urethane elastomers (e.g., Nippolane 4040 available from Nippon Polyurethane K.K.), and the derivatives thereof having a functional group such as COOH incorporated therein, phenol ethylene oxide adduct diacrylate (methacrylate), compounds having a pentaerythritol fused ring represented by the following general formula and having an acryl or methacryl group or epsilon-caprolactone-acryl group attached thereto:

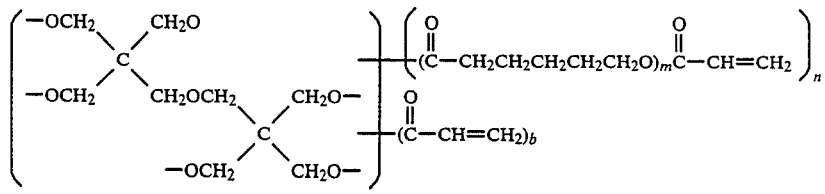

wherein the sum of n plus b is equal to 6, and special acrylates represented by the following general formulae:

formulae of Special Acrylates
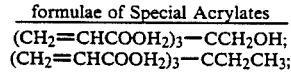

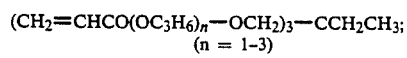
(n = 1-3)

-continued
formulae of Special Acrylates

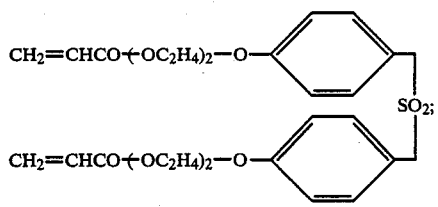

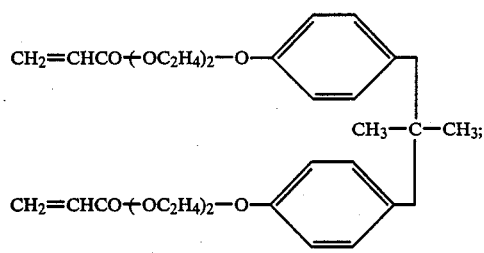

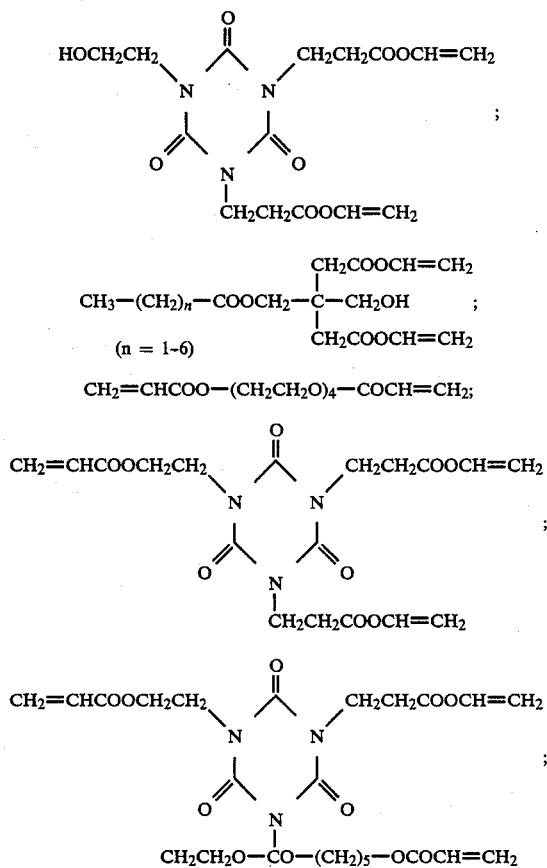

-continued
formulae of Special Acrylates

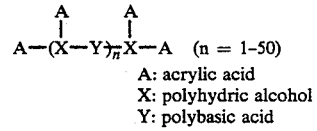

A: acrylic acid
X: polyhydric alcohol
Y: polybasic acid

Examples of the radiation curable oligomers include polyfunctional oligo-ester acrylates having the general formula:

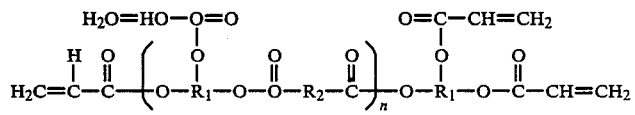

wherein $R_1$ and $R_2$ are independently selected from alkyl radicals and n is an integer, acryl modified products of urethane elastomers, and derivatives thereof having a functional group such as COOH incorporated therein.

The antioxidants used herein include triazoles, imidazoles, thiazoles, dithiocarbamates, thiuram disulfides, amides, naphthols such as β-naphthol and α-nitroso-β-naphthol, triazoles such as benztriazole, and salicylic acid amide compounds disclosed in Japanese Patent Application Kokai No. 59-13080; dihydric phenols, diallylketones, alkylphenols, alkylnaphtols, quinones, nitroso compounds and oxime compounds disclosed in Japanese Patent Application Kokai No. 58-189825; poly-phosphates such as orthophosphates, polyphosphates, tetrapolyphosphates, metaphosphates, cyclic metaphosphates, long-chain crystalline metaphosphates and ultraphosphates disclosed in Japanese Patent Application Kokai No. 58-188330; thiocarboxylic acids and salts thereof such as sodium diethyldithio carbamate, ethanethio acid, rubeanic acid, and thioacetamide disclosed in Japanese Patent Application Kokai No. 58-188331; dicarboxylic acids such as nitrophthalic acid, naphthalic acid, o-phthalic acid, m-phthalic acid, succinic acid and acetoxy succinic acid disclosed in Japanese Patent Application Kokai No. 58-188332; thiazole compounds such as bismuthiol II, diazosulfids, azosulfimes, 1,3,4,-thiadiazoles and piazthiols disclosed in Japanese Patent Application Kokai No. 58-788333; and organic compounds having hydroxyl radical and nitroso radical such as nitrosophenols and nitrosonaphthols disclosed in Japanese Patent Application Kokai No. 58-189832.

When the lubricants, antioxidants, and hardening agents are added to the topcoat composition, it is desired that their total amount added is up to 10 folds of the total weight of the compound or compounds containing a group having a radiation sensitive unsaturated double bond and a fluoro-substituted alkyl group as represented by formulae (I) and (II). It is also desired that the amount of antioxidant added be not more than the total weight of lubricant and hardening agent.

Another preferred example of the topcoat layer 8 formed on the ferromagnetic metal thin film 3, 4 of the magnetic recording medium is a thin plasma-polymerized film containing carbon and fluorine, or carbon, fluorine, and hydrogen.

The thin film containing these elements may be formed by activating a gaseous monomeric reactant into a plasma for plasma polymerization. Exemplary of the gaseous monomers there may be given fluorocarbons such as tetrafluoromethane, octafluoropropane, octafluorocyclobutane, tetrafluoroethylene, hexafluoropropylene, etc., and fluorinated hydrocarbons such as fluoromethane, difluoromethane, trifluoromethane, difluoroethane, tetrafluoroethane, etc., and mixtures thereof. Preferably, they are gaseous at room temperature because of ease of operation.

In admixture with the above-mentioned reactant, there may also be used saturated and unsaturated hydrocarbons, for example, methane, ethane, propane, butane, pentane, ethylene, propylene, butene, butadiene, acetylene, methylacetylene, etc. and mixtures thereof. Another fluoride such as boron fluoride, nitrogen fluoride, and silicon fluoride may also be used as one component of the reactant gas feed in admixture with the fluorine-containing reactant mentioned above. Also, fluorine-containing materials which are liquid or solid at room temperature, for example, Fron 12, Fron 13B1 and Fron 22, may also be used as a reactant if desired or necessary.

The reactant gas feed may optionally contain a minor proportion of nitrogen, oxygen, silicon, boron, phosphorus, etc. Then the topcoat film contains a minor proportion of such an element.

The carbon content of the topcoat film ranges from 30 to 80 atom %, more preferably from 30 to 60 atom %. Dynamic friction increases with carbon contents in excess of 80 atom % whereas carbon contents of less than 30 atom % detract from runnability.

In the preferred topcoat film, the atomic ratio of hydrogen to fluorine (H/F) ranges from 0 to 1:1, more preferably from 0 to 9:10. Dynamic friction increases with H/F ratios of more than 1.

The topcoat film preferably contains carbon and fluorine at an atomic ratio of fluorine to carbon (F/C) in the range from 3:10 to 2:1, more preferably from 1:2 to 2:3. A satisfactory loss of dynamic friction is not expected at a F/C ratio of less than 3/10. A F/C ratio of more than 2 results in a considerable output reduction with increasing passes.

Where the topcoat film contains carbon, fluorine, and hydrogen, the atomic ratio of carbon to hydrogen (C/H) ranges from 2:1 to 8:1, preferably from 5:2 to 5:1. A C/H ratio of less than 2 is insufficient to ensure corrosion resistance whereas a C/H ratio in excess of 8 detracts from durability. The atomic ratio of hydrogen to fluorine (H/F) preferably ranges from 2:10 to 1:1, more preferably from 2:10 to 9:10. H/F ratios of less than 2/10 provide less satisfactory durability. Initial friction becomes too high with H/F ratios of more than 1.

In one preferred embodiment, the topcoat film is formed such that the atomic ratio of fluorine to carbon (F/C) increases toward the surface of the film. More illustratively, in the plasma-polymerized topcoat film, the average F/C atom ratio in the upper region of the film that extends from the surface remote from the substrate to ⅓rd of its thickness is at least 1.5 times, more preferably at least twice that in the lower region of the film that extends from the surface adjacent to the substrate to ⅓rd of its thickness. The topcoat film having such a gradient or distribution of fluorine concentration generally contains carbon, fluorine, and hydrogen, provided that the contents of carbon and the remaining elements in the entire film are within the above-defined range.

More preferably, the average F/C atom ratio in the upper ⅓ region of the film ranges from 3/2 to 3/1 whereas the average F/C atom ratio in the lower ⅓ region of the film ranges from 1/1 to 3/2, with the ratio of the former to the latter being at least 3/2. The presence of a fluorine rich surface region in the topcoat film increases the durability of the medium. The distribution of fluorine and carbon may be either continuous or discontinuous as long as the above-mentioned gradient is imparted. Such a graded distribution can be accomplished by controlling the composition of the plasma reactant gas feed with the lapse of time.

Elemental analysis of F/C in the topcoat film may be carried out by any conventional techniques such as SIMS, ESCA, and Auger spectroscopy. The procedure of SIMS is as previously described.

The plasma-polymerized film topcoat has a thickness of 3 to 80 Å. A thickness in excess of 80 Å results in an undesirably increased spacing loss. Less than 3 Å fails to provide the desired effect. It is to be noted that the thickness of the plasma-polymerized film preferably ranges from 3 to 40 Å.

Preferably, the topcoat layer has a contact angle with water in the range from 100° to 130°, more preferably from 110° to 125°. Topcoat layers having a contact angle of less than 100° exhibit a higher initial friction and are unacceptable for actual utility. Plasma-polymerized films having a contact angle of more than 130° are difficult to form and unnecessary for most applications.

The film thickness may be measured by means of an ellipsometer and can be controlled by a choice of the reaction time, feed gas flow rate and other factors during film formation by plasma polymerization.

Preferably, the plasma-polymerized film is prepared by feeding a gaseous reactant into a plasma zone with W/(F.M) set to at least $10^7$ joule/kg where W is an input power applied for plasma generation as expressed in joule/sec., F is a flow rate of the reactant gas as expressed in kg/sec., and M is the molecular weight of the reactant. If W/F.M is less than $10^7$, the resulting plasma-polymerized film is insufficiently dense to provide the desired corrosion resistance. The upper limit of parameter W/F.M is generally about $10^{15}$ joule/kg. It is to be noted that when more than one reactant is used, F and M are the sum of them.

The reactant gases may be fed each at a flow rate of 1 to 250 ml per minute.

In operation, the reactor vessel R (see FIG. 6) is first evacuated by means of the vacuum pump to a vacuum of $10^{-3}$ Torr or lower before a reactant gas or gases are fed into the vessel at a predetermined flow rate. Then the interior of the reactor vessel is maintained at a vacuum of 0.01 to 10 Torr. When the flow rate of the reactant gas becomes constant, the variable frequency power is turned on to generate a plasma with which the reactant is polymerized to form a plasma-polymerized film on the subject.

For plasma polymerization, a carrier gas such as argon, helium, nitrogen and hydrogen may be used.

The frequency of the power source is not critical to the plasma treatment according to the present invention. The source may be of DC, AC, and microwave as well as radio-frequency discharge. Current supply and treating time may be as usual.

Protrusions

In a further preferred embodiment, the magnetic recording medium of the present invention may be provided on its magnetic layer side surface with fine protrusions in a predetermined population. The fine protrusions used herein are those having a height of 30 to 300 Å, more preferably 50 to 250 Å as measured from the standard medium surface. The protrusions provided in the present invention have such dimensions that they are not observable under an optical microscope or measureable by a probe type surface roughness meter, but can only be observable under a scanning electron microscope. Larger protrusions in excess of 300 Å which are observable under an optical microscope are not desirable because of deteriorated electromagnetic properties and low stability in operation. Smaller protrusions of lower than 30 Å are not effective in improving physical properties.

The protrusions are distributed on the surface of the magnetic recording medium at an average density of at least $10^5$, and preferably $10^5$ to $10^9$, and more preferably $10^6$ to $10^8$ per square millimeter of the surface. At protrusion densities of less than $10^5/mm^2$, there result increased noise, deteriorated still performance, and other disadvantages, which are undesirable in practical applications. Higher protrusion densities of more than $10^9/mm^2$ are rather less effective in improving physical properties. The protrusions generally have a diameter of 200 to 1,000 Å.

The protrusions may generally be provided by initially placing submicron particles on the surface of the substrate. The submicron particles used herein may have a particle size of 30 to 1,000 Å. Submicron protrusions are then formed on the top surface of the medium which conform to the submicron particles on the substrate surface in shape and size.

The submicron particles used in the practice of the present invention are those generally known as colloidal particles. Examples of the particles which can be used herein include $SiO_2$ (colloidal silica), $Al_2O_3$ (alumina sol), MgO, $TiO_2$, ZnO, $Fe_2O_3$, zirconia, CdO, NiO, $CaWO_4$, $CaCO_3$, $BaCO_3$, $CoCO_3$, $BaTiO_3$, Ti (titanium black), Au, Ag, Cu, Ni, Fe, various hydrosols, and resinous particles. Inorganic particles are preferred among others.

The submicron particles may be placed on the substrate surface, for example, by dispersing them in a suitable solvent to form a dispersion, and applying the dispersion to the substrate followed by drying. Any aqueous emulsion containing a resinous component as matting agent may also be added to the particle dispersion before it is applied to the substrate. The addition of a resinous component allows gently sloping protrusions to form in conformity to the particles although it is not critical in the present invention.

Alternatively, protrusions may be formed by applying such a particle dispersion to the magnetic thin film as a topcoat layer rather than the placement of particles on the substrate surface.

The magnetic recording medium of the present invention may be provided with a topcoat layer on the ferromagnetic metal thin film preferably having formed thereon protrusions of the size and distribution density defined above.

The present invention provides a magnetic layer having an improved film strength since the magnetic layer is of a multi-layered structure consisting of at least two plies so that each magnetic ply can be composed of magnetic columnar crystal grains of reduced length. The magnetic recording medium having such a magnetic layer exhibits highly enhanced dynamic stability in operation, undergoes minimized crack and abrasion on the magnetic layer due to frictional contact during operation, causes minimized removal of the associated head, and produces minimized dropouts.

The presence of carbon in the form of an organic polymer in the magnetic layer minimizes curling or cupping of the medium which produces a stable output and exhibits improved corrosion resistance and runnability.

By providing a plasma-polymerized film between the lowermost ply and the substrate, or between two adjoining plies of the magnetic layer, or on the surface of the uppermost ply remote from the substrate, the magnetic recording medium is markedly improved in durability, abrasion resistance, weatherability, corrosion resistance, and head grip, promising a high level of reliability for actual operation.

By providing a topcoat layer of the specific composition, the magnetic recording medium is markedly improved in dynamic stability, head contact, output maintenance, and envelope in various environments.

Because of the specific oxygen profile that the quotient C2/C1 of the lowermost side oxygen concentration C2 divided by the uppermost side oxygen concentration C1 is up to 0.3, the uppermost layer has a relatively high coercive force Hc sufficient to effectively hold signals having a relatively shallow magnetic field and a central frequency of about 5 MHz, offering an improved resolution. These benefits become more when columnar grains of the uppermost layer are inclined at an angle of 20° to 90°, especially 50° to 90° with respect to a normal to the substrate major surface.

The lowermost layer has a relatively high maximum residual magnetic flux $\phi r$ and squareness ratio sufficient to effectively hold signals having a relatively deep magnetic field and a central frequency of about 0.75 MHz. These benefits also become more when columnar grains of the lowermost layer are inclined at an angle of up to 50° with respect to a normal to the substrate major surface. The presence of a peak of coercive force in proximity to the interface of the uppermost layer-adjoining layer with the uppermost layer is further effective in enhancing the tendency.

DESCRIPTION OF THE PREFERRED EMBODIMENTS

Examples of the present invention are given below by way of illustration and not by way of limitation.

Example 1

A length of polyester (PET) base film having the thickness shown in Table 1 was surface treated with a plasma. The plasma treatment was carried out by supplying argon at a flow rate of 100 ml/min. and a vacuum of 0.05 Torr, and generating a plasma using a power source of 200 watts at 50 KHz. The PET substrate was transferred from a supply roll to a take-up roll along the peripheral surface of a cooling cylindrical can in a vacuum chamber which was maintained at a vacuum of $1.0 \times 10^{-4}$ Torr by passing a mixture of oxygen and argon ($O_2/Ar$ 1:1 by volume) at a flow rate of 800 ml/min. A metal material was deposited on the plasma-treated surface of the substrate by the standard oblique evaporation process. A 80/20 (weight ratio) Co/Ni alloy was melted and evaporated by heating and deposited on the substrate at the minimum incident angle reported in Table 1. Evaporation was conducted twice by resetting the once takeup roll as a supply roll, forming a thin film of two Co-Ni-O layers oriented as shown in FIG. 1. The minimum incident angle $\theta$min of depositing material and the thickness of the magnetic layer are shown in Table 1.

For comparison purposes, the alloy was deposited on the substrate by the oblique evaporation process at an incident angle varying from 30° to 90°, forming a single layer metal thin film of Co-Ni-0 having a thickness of 0.15 μm.

During the deposition, ethylene $C_2H_4$ gas as a typical organic compound was introduced into the vacuum chamber in a predetermined amount concurrently with metal evaporation. Once the organic material was incorporated in the magnetic layer, the substrate was subsequently passed through a plasma treating vessel to polymerize the organic material in the magnetic layer. The plasma treatment was an RF plasma polymerization using argon at a vacuum of 0.01 Torr, a radio frequency of 13.56 MHz, and a power source of 500 watts.

The average carbon/metal ratio of the magnetic layer was calculated by analyzing the layer by Auger spectroscopy or SIMS with ion etching and counting the number of elements to determine the profiles of the respective elements in a thickness direction. More particularly, a reference sample, cobalt carbide $Co_2C$ was first analyzed to determine a measurement sensitivity. Then the C/Co ratio is calculated by the equation:

$$C/Co = \frac{(C \text{ count}) \times (C \text{ measurement sensitivity})}{(Co \text{ count}) \times (Co \text{ measurement sensitivity})}.$$

With respect to Ni and other elements, a sensitivity ratio relative to Co was calculated as a correction factor.

For the two-layer structure, analysis showed that oxygen locally predominated at the interface between the upper and lower layers and the exposed surface of the upper layer remote from the substrate. The upper layer exposed surface was essentially coated with oxides. The two-layered film had a coercive force Hc of 1,000 oersted (Oe) and an average oxygen content of 40% calculated as atom ratio of oxygen to cobalt and nickel atoms according to $O/(Co+Ni) \times 100\%$.

The metal thin film was examined to determine the O/Co or O/(Co+Ni) atom ratio by Auger spectroscopy while ion etching with Ar. Table 1 reports such atom ratios wherein C1 is the atom ratio at the exposed surface of the upper layer, C1* is the average atom ratio of the upper layer, C3 is the atom ratio at the interface of the lower layer with the upper layer, C2* is the average atom ratio of the lower layer, and C2 is the atom ratio at the interface of the lower layer with the substrate.

The rear surface of the metallized substrate was treated with a plasma and then coated with a backcoat layer as shown below. The plasma treatment was carried out by supplying a treating gas of oxygen ($O_2$) at a flow rate of 100 ml/min. and a vacuum of 0.5 Torr, generating a plasma using a power source of 200 watts at 50 KHz, and moving the substrate at a speed of 30 m/min.

When necessary, a topcoat layer as shown below was applied on the magnetic layer. The resulting magnetic recording medium sample had the structure shown in FIG. 1. The thickness of the backcoat and topcoat layers is reported in Table 1.

| Formation of Backcoat Layer | |
|---|---|
| Backcoat composition | Parts by weight |
| Carbon black | 7 |
| $SiO_2$ | 2 |
| Acryl-modified vinyl chloride-vinyl acetate-vinyl alcohol copolymer | 30 |
| Acryl-modified polyurethane elastomer | 10 |
| Acrylic ester oligomer | 4 |
| Dispersing aid | 0.4 |

A mixture of the ingredients was milled for dispersion in a ball mill for 5 hours. The composition was coated on the plasma-treated rear surface of the substrate. It was exposed to electron radiation in a nitrogen atmosphere by operating an electrocurtain type electron accelerator at an accelerating voltage of 150 keV and an electrode current of 10 milliamperes to a dose of 5 Mrad, obtaining a backcoat layer having a dry thickness of 0.5 μm.

Formation of Topcoat Layer

A topcoat layer was formed by applying the following composition on the magnetic layer. The compounds used are designated by F-numbers previously listed as illustrative examples thereof.

| Topcoat composition | Parts by weight |
|---|---|
| Butyl myristate (mp = 1.0° C.) | 0.5 |
| F-2 | 0.3 |
| MEK | 30 |
| Cyclohexanone | 70 |

The ingredients were mixed for one hour at room temperature. The resulting mixture was gravure coated onto the magnetic layer to a uniform thickness, dried at 100° C. for one minute, and then exposed to electron radiation in a nitrogen atmosphere under conditions of 150 keV, 6 mA, and 3 Mrad, obtaining a topcoat layer of 25 Å thick.

The thus prepared samples of magnetic recording medium as shown in Table 1 were processed to standard video tape size and determined for several physical properties. It is to be noted that the inclination of grains in the lower layer with respect to a normal to the substrate surface is in the same direction as the medium is moved during recording/reproducing operation.

(1) Cupping

A sample was sliced to the width of ½" to measure the cupping height.

(2) Electromagnetic property

A video deck was operated with a tape sample to measure outputs having center frequencies of 0.75 MHz and 5 MHz. Measurements are calculated based upon an output of 0 dB for sample No. 108.

The video deck used was SONY Model A-300 having a sputtered Sendust head. The operation mode was SP mode.

(3) Still life

A video deck loaded with a tape sample was continuously operated in a still mode at a temperature of 0° C. until the output was reduced by 5 dB.

The video deck used was SONY Model A-300 having a sputtered Sendust head, with its automatic still cancelling mechanism removed.

(4) Corrosion resistance ($\Delta\phi m/\phi m$) centimeter was determined.

The results are shown in Table 2.

TABLE 1

| Sample No. | Substrate Thickness (μm) | Structure | $\theta$ min (%) Upper layer | $\theta$ min (%) Lower layer | Thickness (μm) Upper layer | Thickness (μm) Lower layer | Carbon/Metal Upper layer | Carbon/Metal Lower layer | $C_1$ | $C_1^*$ | $C_2$ | $C_2^*$ | $C_3$ | $C_3/C_1$ | $C_2/C_1$ | Backcoat Thickness (μm) | Topcoat Thickness (Å) |
|---|---|---|---|---|---|---|---|---|---|---|---|---|---|---|---|---|---|
| 101 | 10 | 2 layers | 30 | 30 | 0.08 | 0.07 | $\sim 10^{-5}$ | $\sim 10^{-5}$ | 52 | 28 | 2 | 24 | 41 | 0.79 | 0.04 | 0.5 | 25 |
| 102 | 10 | 2 layers | 30 | 30 | 0.08 | 0.07 | $\sim 10^{-7}$ | $10^{-7}$ | 52 | 28 | 2 | 24 | 41 | 0.79 | 0.04 | 0.5 | 25 |
| 103 | 10 | 2 layers | 30 | 30 | 0.08 | 0.07 | $\sim 10^{-5}$ | — | 52 | 28 | 2 | 24 | 41 | 0.79 | 0.04 | 0.5 | 25 |
| 104 | 10 | 2 layers | 30 | 30 | 0.08 | 0.07 | $<10^{-8}$ | $<10^{-8}$ | 52 | 28 | 2 | 24 | 41 | 0.79 | 0.04 | 0.5 | 25 |
| 105 | 10 | 2 layers | 30 | 30 | 0.08 | 0.07 | $<10^{-8}$ | — | 52 | 28 | 2 | 24 | 41 | 0.79 | 0.04 | 0.5 | 25 |
| 106* | 10 | 2 layers | 30 | 30 | 0.08 | 0.07 | — | — | 52 | 28 | 2 | 24 | 41 | 0.79 | 0.04 | 0.5 | 25 |
| 107* | 10 | single | 30 | | 0.15 | | $10^{-5}$ | | 40 | 23 | — | — | — | — | — | 0.5 | 25 |
| 108* | 10 | single | 30 | | 0.15 | | $<10^{-8}$ | | 40 | 23 | — | — | — | — | — | 0.5 | 25 |

*Comparison

TABLE 2

| Sample No. | Still life (min.) | Electromagnetic properties 0.75 MHz (dB) | Electromagnetic properties 5 MHz (dB) | Cupping height (mm) | $-\Delta\theta$ m/$\theta$ m (%) |
|---|---|---|---|---|---|
| 101 | ≧60 | +4.1 | +4.6 | 0.2 | 3.0 |
| 102 | ≧60 | +4.2 | +4.5 | 0.2 | 3.2 |
| 103 | ≧60 | +4.2 | +4.6 | 0.3 | 3.5 |
| 104 | ≧60 | +4.2 | +4.6 | 0.6 | 11.0 |
| 105 | ≧60 | +4.2 | +4.5 | 0.7 | 11.8 |
| 106* | ≧60 | +4.1 | +4.5 | 1.3 | 16.5 |
| 107* | 15 | 0 | +0.1 | 0.2 | 3.9 |
| 108* | 10 | 0 | 0 | 1.2 | 16.0 |

*Comparison

EXAMPLE 2

The procedure for the preparation of the magnetic layer of Example 1 was repeated except that the minimum incident angle of depositing material and the O/Co or O/(Co+Ni) ratio in the magnetic layers were changed as shown in Table 3. Magnetic recording medium sample Nos. 111–122 as shown in Table 3 were completed by forming thereon the same backcoat and topcoat layers as in Example 1.

The samples were tested for several properties by the same procedures as in Example 1. Measurements of electromagnetic property are calculated based upon an output of 0 dB for sample No. 122.

The results are shown in Table 4.

TABLE 3

| Sample No. | Substrate Thickness (μm) | Structure | $\theta$ min (°) Upper layer | $\theta$ min (°) Lower layer | Thickness (μm) Upper layer | Thickness (μm) Lower layer | Carbon/Metal Upper layer | Carbon/Metal Lower layer | $C_1$ | $C_1^*$ | $C_2$ | $C_2^*$ | $C_3$ | $C_3/C_1$ | $C_2/C_1$ | Backcoat Thickness (μm) | Topcoat Thickness (Å) |
|---|---|---|---|---|---|---|---|---|---|---|---|---|---|---|---|---|---|
| 111 | 10 | 2 layers | 30 | 30 | 0.08 | 0.07 | $\sim 10^{-5}$ | $\sim 10^{-5}$ | 52 | 28 | 2 | 24 | 41 | 0.79 | 0.04 | 0.5 | 25 |
| 112 | 10 | 2 layers | 30 | 30 | 0.08 | 0.07 | $\sim 10^{-5}$ | $\sim 10^{-5}$ | 38 | 22 | 2 | 17 | 35 | 0.92 | 0.05 | 0.5 | 25 |
| 113 | 10 | 2 layers | 0 | 30 | 0.08 | 0.07 | $\sim 10^{-5}$ | $\sim 10^{-5}$ | 50 | 26 | 3 | 21 | 40 | 0.8 | 0.06 | 0.5 | 25 |
| 114 | 10 | 2 layers | 30 | 60 | 0.08 | 0.07 | $\sim 10^{-5}$ | $\sim 10^{-5}$ | 45 | 20 | 2 | 22 | 40 | 0.89 | 0.04 | 0.5 | 25 |
| 115 | 10 | 2 layers | 30 | 30 | 0.08 | 0.07 | $\sim 10^{-5}$ | $\sim 10^{-5}$ | 52 | 28 | 1 | 3 | 6 | 0.12 | 0.02 | 0.5 | 25 |
| 116 | 10 | 2 layers | 30 | 30 | 0.08 | 0.07 | $\sim 10^{-5}$ | $\sim 10^{-5}$ | 6 | 2 | 2 | 25 | 45 | 7.5 | 0.33 | 0.5 | 25 |
| 117 | 10 | 2 layers | 30 | 30 | 0.08 | 0.07 | $\sim 10^{-5}$ | $\sim 10^{-5}$ | 63 | 35 | 2 | 3 | 5 | 0.08 | 0.03 | 0.5 | 25 |
| 118 | 10 | 2 layers | 10 | 60 | 0.08 | 0.07 | $\sim 10^{-5}$ | $\sim 10^{-5}$ | 41 | 19 | 4 | 15 | 36 | 0.88 | 0.10 | 0.5 | 25 |
| 119 | 10 | 2 layers | 10 | 60 | 0.08 | 0.07 | $\sim 10^{-5}$ | $\sim 10^{-5}$ | 5 | 3 | 3 | 15 | 32 | 6.4 | 0.60 | 0.5 | 25 |
| 120 | 10 | 2 layers | 30 | 30 | 0.08 | 0.07 | $\sim 10^{-5}$ | $\sim 10^{-5}$ | 51 | 28 | 2 | 22 | 40 | 0.78 | 0.06 | 0.5 | 3 |
| 121 | 10 | 2 layers | 30 | 30 | 0.08 | 0.07 | $\sim 10^{-5}$ | $\sim 10^{-5}$ | 53 | 28 | 2 | 24 | 41 | 0.77 | 0.04 | 0.5 | 250 |
| 122* | 10 | single | 30 | | 0.15 | | $\sim 10^{-5}$ | $\sim 10^{-5}$ | 40 | 23 | — | — | — | — | — | 0.5 | 25 |

*Comparison

TABLE 4

| Sample No. | Still life (min.) | Electromagnetic properties 0.75 MHz (dB) | Electromagnetic properties 5 MHz (dB) | Cupping height (mm) | $-\Delta\theta$ m/$\theta$ m (%) |
|---|---|---|---|---|---|
| 111 | ≧60 | +4.1 | +4.6 | 0.2 | 3.0 |
| 112 | ≧60 | +4.0 | +4.6 | 0.2 | 2.8 |
| 113 | ≧60 | +4.1 | +2.5 | 0.2 | 2.7 |
| 114 | ≧60 | +2.0 | +3.5 | 0.4 | 3.7 |
| 115 | 25 | +3.5 | +4.1 | 0.2 | 2.9 |
| 116 | 5 | +1.5 | +2.0 | 0.2 | 2.7 |
| 117 | 50 | +1.5 | +1.7 | 0.3 | 3.8 |
| 118 | 35 | +2.1 | +2.5 | 0.3 | 3.9 |

TABLE 4-continued

| Sample No. | Still life (min.) | Electomagnetic properties | | Cupping height (mm) | $-\Delta\theta$ m/$\theta$ m (%) |
|---|---|---|---|---|---|
| | | 0.75 MHz (dB) | 5 MHz (dB) | | |
| 119 | 5 | +0.1 | +0.4 | 0.4 | 4.0 |
| 120 | 20 | +4.1 | +4.6 | 0.2 | 3.0 |
| 121 | ≧60 | +2.9 | +3.5 | 0.2 | 2.9 |
| 122* | 15 | 0 | 0 | 0.2 | 2.5 |

*Comparison

EXAMPLE 3

The procedure for the preparation of the magnetic layer of Example 1 was repeated except that the thicknesses of the substrate, upper and lower magnetic layers were changed as shown in Table 5. Magnetic recording medium sample Nos. 131–138 as shown in Table 5 were completed by forming thereon the same backcoat and topcoat layers as in Example 1.

The samples were tested for several properties by the same procedures as in Example 1. Measurements of electromagnetic property are calculated based upon an output of 0 dB for sample No. 138.

The results are shown in Table 6.

In Table 6, increases in output of sample Nos. 131 to 133 and 136 (base thickness 7 μm, double magnetic layers) as compared with sample No. 137 (base thickness 7 μm, single magnetic layer) are also reported in parentheses.

The best performance was observed with those samples having a magnetic layer structure as defined by the present invention.

For substrates having a thickness of up to 8 μm, marked improvements in durability and 5 MHz output are observed when the thickness ratio of the upper to lower layers ranges from 2:10 to 9:10. Even with those substrates which are otherwise too thin to produce an acceptable 5 MHz output, the present invention enables magnetic recording media to exhibit practically satisfactory electromagnetic properties and durability.

Further samples were fabricated by repeating the procedures of the examples except that colloidal silica was distributed over the plasma-treated surface of a polyester substrate by coating to prepare the substrate having fine protrusions adhered thereon. Protrusions had a diameter of 250 Å and a distribution density of $5 \times 10^7/\text{mm}^2$.

For these samples, a reduction was observed in head adherence during high-temperature operation.

EXAMPLE 4

A length of polyester (PET) base film having the thickness shown in Table 7 was surface treated with a plasma. The plasma treatment was carried out by supplying argon at a flow rate of 100 ml/min. and a vacuum of 0.05 Torr, and generating a plasma using a power source of 200 watts at 50 KHz. The PET substrate was transferred from a supply roll to a take-up roll along the peripheral surface of a cooling cylindrical can in a vacuum chamber which was maintained at a vacuum of $1.0 \times 10^{-4}$ Torr by passing a mixture of 1:1 oxygen and argon at a flow rate of 800 ml/min. A metal material was deposited on the plasma-treated surface of the substrate by the standard oblique evaporation process. A 80Co/20Ni alloy was melted and evaporated by heating and deposited on the substrate at the minimum incident angle reported in Table 7. Evaporation was conducted twice by resetting the once taken-up roll as a supply roll, forming a thin film of two Co-Ni-O layers oriented as shown in FIG. 3. The minimum incident angle $\theta$min of depositing material and the thickness of the magnetic layer are shown in Table 7.

For comparison purposes, the alloy was deposited on the substrate by the oblique evaporation process at an incident angle varying from 30° to 90°, forming a single

TABLE 5

| Sample No. | Substrate Thickness (μm) | Structure | $\theta$ min (°) | | Thickness (μm) | | Carbon/Metal | | O/(Co + Ni) | | | | | | Backcoat Thickness (μm) | Topcoat Thickness (Å) |
|---|---|---|---|---|---|---|---|---|---|---|---|---|---|---|---|---|
| | | | Upper layer | Lower layer | Upper layer | Lower layer | Upper layer | Lower layer | $C_1$ | $C_1^*$ | $C_2$ | $C_2^*$ | $C_3$ | $C_3/C_1$ | $C_2/C_1$ | | |
| 131 | 7 | 2 layers | 30 | 30 | 0.05 | 0.10 | $\sim 10^{-5}$ | $\sim 10^{-5}$ | 39 | 20 | 2 | 15 | 35 | 0.90 | 0.05 | 0.5 | 25 |
| 132 | 7 | 2 layers | 30 | 30 | 0.08 | 0.07 | $\sim 10^{-5}$ | $\sim 10^{-5}$ | 47 | 21 | 3 | 20 | 41 | 0.87 | 0.06 | 0.5 | 25 |
| 133 | 7 | 2 layers | 10 | 60 | 0.10 | 0.05 | $\sim 10^{-5}$ | $\sim 10^{-5}$ | 6 | 3 | 2 | 16 | 35 | 5.8 | 0.33 | 0.5 | 25 |
| 134 | 10 | 2 layers | 30 | 30 | 0.05 | 0.10 | $\sim 10^{-5}$ | $\sim 10^{-5}$ | 38 | 22 | 2 | 17 | 35 | 0.92 | 0.05 | 0.5 | 25 |
| 135 | 10 | 2 layers | 10 | 60 | 0.10 | 0.05 | $\sim 10^{-5}$ | $\sim 10^{-5}$ | 5 | 4 | 3 | 16 | 38 | 7.6 | 0.6 | 0.5 | 25 |
| 136* | 7 | 2 layers | 30 | 30 | 0.05 | 0.10 | — | — | 39 | 20 | 2 | 15 | 35 | 0.90 | 0.05 | 0.5 | 25 |
| 137* | 7 | single | 30 | | 0.15 | | $\sim 10^{-5}$ | | 41 | 20 | — | — | — | — | — | 0.5 | 25 |
| 138* | 10 | single | 30 | | 0.15 | | $\sim 10^{-5}$ | | 40 | 23 | — | — | — | — | — | 0.5 | 25 |

*Comparison

TABLE 6

| Sample No. | Still life (min.) | Electomagnetic properties | | Cupping height (mm) | $-\Delta\phi$ m/$\phi$ m (%) |
|---|---|---|---|---|---|
| | | 0.75 MHz (dB) | 5 MHz (dB) | | |
| 131 | ≧60 | +5.1 (6.3) | +5.1 (7.2) | 0.4 | 3.3 |
| 132 | ≧60 | +3.0 (4.2) | +3.4 (5.5) | 0.5 | 3.6 |
| 133 | 5 | −1.1 (0.1) | −1.3 (0.8) | 0.6 | 3.9 |
| 134 | ≧60 | +5.8 | +5.6 | 0.2 | 2.8 |
| 135 | 5 | +0.1 | +0.8 | 0.3 | 3.5 |
| 136* | ≧60 | +5.2 (6.4) | +5.0 (7.1) | 1.5 | 17.0 |
| 137* | 15 | −1.2 (0) | −2.1 (0) | 0.4 | 3.5 |
| 138* | 15 | 0 | 0 | 0.2 | 2.5 |

*Comparison

The benefits of the present invention are evident from the data of Tables 1–6.

layer metal thin film of Co-Ni-O having a thickness of 0.15 μm.

During the deposition, ethylene $C_2H_4$ gas as a typical organic compound was introduced into the vacuum chamber in a predetermined amount concurrently with metal evaporation. Once the organic material was incorporated in the magnetic layer, the substrate was subsequently passed through a plasma treating vessel to polymerize the organic material in the magnetic layer. The plasma treatment was an RF plasma polymerization using argon at a vacuum of 0.01 Torr, a radio frequency of 13.56 MHz, and a power source of 500 watts.

The average carbon/metal ratio of the magnetic layer was calculated by analyzing the layer by Auger spectroscopy as in Example 1.

For the two-layer structure, analysis showed that oxygen locally predominated at the interface between the upper and lower layers and the exposed surface of the upper layer remote from the substrate. The upper layer exposed surface was essentially coated with oxides. The two-layered film had a coercive force Hc of 1,000 Oe and an average oxygen content of 40% calculated as atom ratio of oxygen to cobalt and nickel atoms according to $O/(Co+Ni) \times 100\%$.

The metal thin film was examined to determine the O/Co or $O/(Co+Ni)$ atom ratio by Auger spectroscopy while ion etching with Ar. Table 7 reports such atom ratios wherein C1 is the atom ratio at the exposed surface of the upper layer, C1* is the average atom ratio of the upper layer, C3 is the atom ratio at the interface of the lower layer with the upper layer, C2* is the average atom ratio of the lower layer, and C2 is the atom ratio at the interface of the lower layer with the substrate.

A plasma-polymerized film was formed between the substrate and the lower magnetic layer, or between the upper and lower magnetic layers, or on the surface of the upper magnetic layer remote from the substrate under the following conditions.

The substrate was placed in a vacuum chamber which was evacuated to a vacuum of $10^{-3}$ Torr as shown in FIG. 6. A 1/1 mixture of $CH_4$ as hydrocarbon gas and Ar as carrier gas was introduced into the chamber so as to maintain a gas pressure of 0.1 Torr. A radio frequency voltage was applied at 13.56 MHz and 500 watts to generate a plasma flame, with which the reactant was polymerized to form a plasma-polymerized film. The parameter W/F.W was set to $5 \times 10^8$ joule/kg and the film had a thickness as reported in Table 7 and a C/H ratio of 2.

The rear surface of the metallized substrate was treated with a plasma and then coated with a backcoat layer as shown below. The plasma treatment was carried out by supplying a treating gas of oxygen ($O_2$) at a flow rate of 100 ml/min. and a vacuum of 0.5 Torr, generating a plasma using a power source of 200 watts at 50 KHz, and moving the substrate at a speed of 30 m/min.

When necessary, a topcoat layer as shown below was applied on the magnetic layer. The resulting magnetic recording medium sample had the structure shown in FIG. 3. The thickness of the backcoat and topcoat layers is reported in Table 7.

The composition and preparation of the backcoat and topcoat layers were substantially the same as in Example 1.

The thus prepared samples of magnetic recording medium as shown in Table 7 were processed to standard video tape size and determined for several physical properties. It is to be noted that the inclination of grains in the lower layer with respect to a normal to the substrate surface is in the same direction as the medium is moved during recording/reproducing operation.

(1) Still life
Same as in Example 1.
(2) Electromagnetic property
Same as in Example 1.
(3) Corrosion resistance ($\Delta\phi m/\phi m$)
Same as in Example 1.
(4) Rupture strength (RS)

The strength of a tape sample of 8 mm wide was measured at which it was broken by increasing a pulling force. The measurement results are expressed as a relative value to sample No. 222 (substrate 10 μm thick, single magnetic layer, free of plasma-polymerized film).

The results are shown in Table 8.

TABLE 7

| Sample No. | Substrate thickness (μm) | Structure | θ min(°) Upper layer | θ min(°) Lower layer | Thickness (μm) Upper layer | Thickness (μm) Lower layer | Carbon/Metal Upper layer | Carbon/Metal Lower layer | $C_1$ | $C_1^*$ | $C_2$ | $C_2^*$ | $C_3$ | $O/(CO+Ni)$ $C_3/C_1$ | $C_2/C_1$ | Back-coat | Top-coat | Location** | Reactant | W/F.M (Joule/Kg) | Thickness (Å) | C/H |
|---|---|---|---|---|---|---|---|---|---|---|---|---|---|---|---|---|---|---|---|---|---|---|
| 201 | 10 | 2 layers | 30 | 30 | 0.08 | 0.07 | $\sim 10^{-5}$ | $\sim 10^{-5}$ | 52 | 28 | 2 | 24 | 41 | 0.79 | 0.04 | Yes | Yes | Top | $CH_4$ | $5 \times 10^8$ | 10 | 2.0 |
| 202 | 10 | 2 layers | 30 | 30 | 0.08 | 0.07 | $\sim 10^{-7}$ | $\sim 10^{-7}$ | 38 | 22 | 2 | 17 | 35 | 0.92 | 0.05 | Yes | Yes | Top | $CH_4$ | $5 \times 10^8$ | 10 | 2.0 |
| 203 | 10 | 2 layers | 0 | 30 | 0.08 | 0.07 | $\sim 10^{-7}$ | $\sim 10^{-7}$ | 50 | 26 | 3 | 21 | 40 | 0.8 | 0.06 | Yes | Yes | Top | $CH_4$ | $5 \times 10^8$ | 10 | 2.0 |
| 204 | 10 | 2 layers | 30 | 0 | 0.08 | 0.07 | $\sim 10^{-7}$ | $\sim 10^{-7}$ | 45 | 20 | 2 | 22 | 40 | 0.89 | 0.04 | Yes | Yes | Top | $CH_4$ | $5 \times 10^8$ | 10 | 2.0 |
| 205 | 10 | 2 layers | 30 | 30 | 0.08 | 0.07 | $\sim 10^{-5}$ | — | 52 | 28 | 1 | 3 | 6 | 0.12 | 0.02 | Yes | Yes | Top | $CH_4$ | $5 \times 10^8$ | 10 | 2.0 |
| 206 | 10 | 2 layers | 30 | 30 | 0.08 | 0.07 | $\sim 10^{-5}$ | $\sim 10^{-5}$ | 6 | 2 | 2 | 25 | 45 | 7.5 | 0.33 | Yes | Yes | Top | $CH_4$ | $5 \times 10^8$ | 10 | 2.0 |
| 207 | 10 | 2 layers | 30 | 30 | 0.08 | 0.07 | $\sim 10^{-5}$ | $\sim 10^{-5}$ | 63 | 35 | 2 | 3 | 5 | 0.08 | 0.03 | Yes | Yes | Top | $CH_4$ | $5 \times 10^8$ | 10 | 2.0 |
| 208 | 10 | 2 layers | 10 | 60 | 0.08 | 0.07 | $\sim 10^{-5}$ | $\sim 10^{-5}$ | 41 | 19 | 4 | 15 | 36 | 0.88 | 0.10 | Yes | Yes | Top | $CH_4$ | $5 \times 10^8$ | 10 | 2.0 |
| 209 | 10 | 2 layers | 10 | 60 | 0.08 | 0.07 | $\sim 10^{-5}$ | $\sim 10^{-5}$ | 5 | 3 | 3 | 15 | 32 | 6.4 | 0.6 | Yes | Yes | Top | $CH_4$ | $5 \times 10^8$ | 10 | 2.0 |
| 210 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | Top | $CH_4$ | $5 \times 10^8$ | 10 | 2.0 |
| 211 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | Inter | $CH_4$ | $5 \times 10^8$ | 25 | 2.2 |
| 212 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | Top | $CH_4$ | $5 \times 10^8$ | 60 | 3.5 |
| 213 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | Top | $C_2H_6$ | $1 \times 10^{10}$ | 20 | 5.0 |
| 214 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | — | — | — | — | — |
| 215 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | Top | $CH_4$ | $6 \times 10^6$ | 10 | 0.8 |
| 216 | 10 | 2 layers | 30 | 30 | 0.08 | 0.07 | $\sim 10^{-5}$ | $\sim 10^{-5}$ | 51 | 29 | 3 | 23 | 40 | 0.78 | 0.06 | Yes | Yes | Top | $CH_4$ | $5 \times 10^8$ | 10 | 0.8 |
| 217 | 10 | 2 layers | 30 | 30 | 0.08 | 0.07 | $\sim 10^{-5}$ | $<10^{-8}$ | 51 | 29 | 3 | 23 | 40 | 0.78 | 0.06 | Yes | Yes | Top | $CH_4$ | $5 \times 10^8$ | 10 | 2.0 |
| 218 | 10 | 2 layers | 30 | 30 | 0.08 | 0.07 | $<10^{-8}$ | — | 51 | 29 | 3 | 23 | 40 | 0.78 | 0.06 | Yes | Yes | Top | $CH_4$ | $5 \times 10^8$ | 10 | 2.0 |
| 219* | 10 | 2 layers | 30 | 30 | 0.08 | 0.07 | — | — | 51 | 29 | 3 | 23 | 40 | 0.78 | 0.06 | Yes | Yes | Top | $CH_4$ | $5 \times 10^8$ | 10 | 2.0 |
| 220* | 10 | single | 30 | 30 | 0.08 | 0.07 | $10^{-5}$ | — | 40 | 23 | — | — | — | — | — | Yes | Yes | Top | $CH_4$ | $5 \times 10^8$ | 10 | 2.0 |
| 221* | 10 | single | 30 | 30 | 0.08 | 0.07 | $<10^{-8}$ | — | 40 | 23 | — | — | — | — | — | Yes | Yes | Top | $CH_4$ | $5 \times 10^8$ | 10 | 2.0 |
| 222* | 10 | single | 30 | 30 | 0.08 | 0.07 | — | — | 40 | 23 | — | — | — | — | — | Yes | Yes | — | — | — | — | — |

*Comparison
**Inter: intermediate the upper and lower magnetic layers
Top: Top surface of magnetic layer remote from the substrate

TABLE 8

| Sample No. | Still life (min.) | Electromagnetic properties | | ΔΦm/Φm | RS |
|---|---|---|---|---|---|
| | | 0.75 MHz (dB) | 5 MHz (dB) | | |
| 201 | ≧60 | +4.1 | +4.6 | 2.3 | 1.9 |
| 202 | ≧60 | +4.0 | +4.5 | 2.6 | 1.8 |
| 203 | ≧60 | +4.1 | +2.5 | 2.5 | 1.7 |
| 204 | ≧60 | +2.0 | +3.5 | 2.7 | 1.8 |
| 205 | 35 | +3.6 | +4.2 | 2.2 | 1.9 |
| 206 | 15 | +1.6 | +2.0 | 2.3 | 2.0 |
| 207 | 60 | +1.6 | +1.6 | 2.1 | 1.9 |
| 208 | 45 | +2.1 | +2.4 | 2.2 | 1.5 |
| 209 | 15 | 0 | +0.5 | 2.4 | 1.6 |
| 210 | ≧60 | +4.2 | +4.5 | 2.8 | 1.8 |
| 211 | ≧60 | +4.1 | +4.5 | 2.3 | 1.9 |
| 212 | ≧60 | +4.0 | +4.6 | 2.2 | 2.0 |
| 213 | ≧60 | +4.2 | +4.4 | 2.2 | 1.9 |
| 214 | ≧60 | +4.1 | +4.5 | 3.1 | 1.3 |
| 215 | ≧60 | +4.1 | +4.4 | 2.0 | 1.5 |
| 216 | ≧60 | +4.2 | +4.6 | 2.0 | 1.6 |
| 217 | ≧60 | +4.0 | +4.6 | 3.8 | 1.6 |
| 218 | ≧60 | +4.1 | +4.5 | 4.1 | 1.5 |
| 219* | ≧60 | +4.1 | +4.5 | 4.4 | 1.5 |
| 220* | 25 | 0 | +0.1 | 2.9 | 1.6 |
| 221* | 20 | 0 | 0 | 4.7 | 1.5 |
| 222* | 10 | 0 | 0 | 16.0 | 1.0 |

*Comparison

EXAMPLE 5

The procedure for the preparation of the magnetic layer of Example 4 was repeated except that the thicknesses of the substrate and upper and lower magnetic layers were changed as shown in Table 9. Magnetic recording medium sample Nos. 231–237 as shown in Table 9 were completed by forming thereon the same backcoat and topcoat layers as in Example 1.

All the magnetic layers had a carbon-to-metal ratio of $10^{-5}:1$ regardless of whether they had a two or one layer structure.

The samples were tested for several properties by the same procedures as in Example 4. Measurements of electromagnetic property are calculated based upon an output of 0 dB for sample No. 237.

The results are shown in Table 10.

In Table 10, increases in output of sample Nos. 231 to 234 (substrate thickness 7 μm, double magnetic layers) as compared with sample No. 235 (substrate thickness 7 μm, single magnetic layer) are also reported in parentheses.

TABLE 9

| Sample No. | Substrate thickness (μm) | Magnetic Layer Structure | θmin(°) Upper layer | θmin(°) Lower layer | Thickness (μm) Upper layer | Thickness (μm) Lower layer | Upper/Lower | $C_1$ | $C_1^*$ | $C_2$ | $C_2^*$ | $C_3$ | O/(CO+Ni) $C_3/C_1$ | $C_2/C_1$ | Back-coat | Top-coat | Plasma-polymerized film Location** | Reactant | W/F.M (Joule/Kg) | Thickness (Å) | C/H |
|---|---|---|---|---|---|---|---|---|---|---|---|---|---|---|---|---|---|---|---|---|---|
| 231 | 7 | 2 layers | 30 | 30 | 0.05 | 0.10 | 0.5 | 39 | 20 | 2 | 15 | 35 | 0.90 | 0.05 | Yes | Yes | Top | CH$_4$ | 5 × 10$^8$ | 10 | 2.0 |
| 232 | 7 | 2 layers | 30 | 30 | 0.08 | 0.07 | 1.14 | 47 | 21 | 3 | 20 | 41 | 0.87 | 0.06 | Yes | Yes | Top | CH$_4$ | 5 × 10$^8$ | 10 | 2.0 |
| 233 | 7 | 2 layers | 10 | 60 | 0.10 | 0.05 | 2.0 | 6 | 3 | 2 | 16 | 35 | 5.8 | 0.33 | Yes | Yes | Top | CH$_4$ | 5 × 10$^8$ | 10 | 2.0 |
| 234 | 10 | 2 layers | 30 | 30 | 0.05 | 0.10 | 0.5 | 38 | 22 | 2 | 17 | 35 | 0.92 | 0.05 | Yes | Yes | Inter | CH$_4$ | 5 × 10$^8$ | 10 | 2.0 |
| 235* | 7 | single | | 30 | | 0.15 | | 41 | 20 | — | — | — | — | — | Yes | Yes | Top | CH$_4$ | 5 × 10$^8$ | 10 | 2.0 |
| 236* | 7 | single | | 30 | | 0.15 | | 41 | 20 | — | — | — | — | — | Yes | Yes | — | — | — | — | — |
| 237* | 10 | single | | 30 | | 0.15 | | 40 | 23 | — | — | — | — | — | Yes | Yes | Top | CH$_4$ | 5 × 10$^8$ | 10 | 2.0 |

*Comparison
**Inter: intermediate the upper and lower magnetic layers
Top: Top surface of magnetic layer remote from the substrate

TABLE 10

| Sample No. | Still life (min.) | Electromagnetic properties | | $\Delta\Phi m/\Phi m$ |
|---|---|---|---|---|
| | | 0.75 MHz (dB) | 5 MHz (dB) | |
| 231 | ≧60 | +5.0 (6.3) | +5.1 (7.2) | 2.3 |
| 232 | ≧60 | +3.2 (4.5) | +3.5 (5.6) | 2.1 |
| 233 | 15 | −1.1 (0.2) | −1.2 (0.9) | 2.6 |
| 234 | ≧60 | +5.6 (6.9) | +5.7 (7.8) | 2.4 |
| 235* | 25 | −1.3 (0) | −2.1 (0) | 2.5 |
| 236* | 15 | −1.1 | −2.2 | 16.5 |
| 237* | 25 | 0 | 0 | 2.9 |

*Comparison

The benefits of the present invention are evident from the data of Tables 7–10.

The best performance was observed with those samples having a magnetic layer structure and a plasma-polymerized film as defined by the present invention.

For substrates having a thickness of up to 8 μm, marked improvements in durability and 5 MHz output are observed (sample No. 231) when the thickness ratio of the upper to lower layers ranges from 2:10 to 9:10. Even with those substrates which are otherwise too thin to produce an acceptable 5 MHz output, the present invention enables magnetic recording media to exhibit practically satisfactory electromagnetic properties and durability.

EXAMPLE 6

Colloidal silica was coated onto the surface of a substrate on which a magnetic layer was to be subsequently formed, forming minute protrusions on the substrate. The protrusion was 250 Å high and distributed at a density of $5 \times 10^7/mm^2$.

The manufacturing and testing procedures of Examples 5 and 6 were repeated using the substrate having such protrusions. It was found that the amount of material adhered to the head during high-temperature operation was reduced by about 30–40%.

EXAMPLE 7

A length of polyester (PET) base film having the thickness shown in Table 11 was surface treated with a plasma. The plasma treatment was carried out by supplying argon at a flow rate of 100 ml/min. and a vacuum of 0.05 Torr, and generating a plasma using a power source of 200 watts at 50 KHz. The PET substrate was transferred from a supply roll to a take-up roll along the peripheral surface of a cooling cylindrical can in a vacuum chamber which was maintained at a vacuum of $1.0 \times 10^{-4}$ Torr by passing a mixture of 1:1 oxygen and argon at a flow rate of 800 ml/min. A metal material was deposited on the plasma-treated surface of the substrate by the standard oblique evaporation process. A 80Co/20Ni alloy was melted and evaporated by heating and deposited on the substrate at the minimum incident angle reported in Table 11. Evaporation was conducted twice by resetting the once taken-up roll as a supply roll, forming a thin film of two Co-Ni-O layers oriented as shown in FIG. 1. The minimum incident angle $\theta$min of depositing material and the thickness of the magnetic layer are shown in Table 11.

For comparison purposes, the alloy was deposited on the substrate by the oblique evaporation process at an incident angle varying from 30° to 90°, forming a single layer metal thin film of Co-Ni-O having a thickness of 0.15 μm.

During the deposition, ethylene $C_2H_4$ gas as a typical organic compound was introduced into the vacuum chamber in a predetermined amount concurrently with metal evaporation. Once the organic material was incorporated in the magnetic layer, the substrate was subsequently passed through a plasma treating vessel to polymerize the organic material in the magnetic layer. The plasma treatment was an RF plasma polymerization using argon at a vacuum of 0.01 Torr, a radio frequency of 13.56 MHz, and a power source of 500 watts.

The average carbon/metal ratio of the magnetic layer was calculated by analyzing the layer by Auger spectroscopy as in Example 1.

For the two-layer structure, analysis showed that oxygen locally predominated at the interface between the upper and lower layers and the exposed surface of the upper layer remote from the substrate. The upper layer exposed surface was essentially coated with oxides. The two-layered film had a coercive force Hc of 1,000 Oe and an average oxygen content of 40% calculated as atom ratio of oxygen to cobalt and nickel atoms according to $O/(Co+Ni) \times 100\%$.

The metal thin film was examined to determine the O/Co or O/(Co+Ni) atom ratio by Auger spectroscopy while ion etching with Ar. Table 11 reports such atom ratios wherein C1 is the atom ratio at the exposed surface of the upper layer, C1* is the average atom ratio of the upper layer, C3 is the atom ratio at the interface of the lower layer with the upper layer, C2* is the average atom ratio of the lower layer, and C2 is the atom ratio at the interface of the lower layer with the substrate.

A topcoat 8 as shown in FIG. 1 was formed on the magnetic layer 3, 4 by plasma polymerization as follows.

The metallized substrate was placed in a vacuum chamber which was evacuated to a vacuum of $10^{-3}$ Torr as shown in FIG. 6. A selected reactant gas as shown in Table 11 was introduced into the chamber so as to maintain a gas pressure of 0.05 Torr. A radio frequency voltage was applied at 13.56 MHz to generate a plasma flame, with which the reactant was polymerized to form a plasma-polymerized film. Elemental analysis of the topcoat layer was carried out by SIMS while ion etching with argon.

In sample No. 324, a plasma-polymerized film was formed between the upper and lower magnetic layers under the following conditions.

| Reactant: | $CH_4$ |
|---|---|
| W/F.W: | $5 \times 10^8$ joule/kg |
| Film thickness: | 10Å |
| C/H: | 2.0 |

The rear surface of the substrate was treated with a plasma and then formed with a backcoat layer. The plasma treatment was carried out by supplying $O_2$ as a treating gas at a flow rate of 100 ml/min. and at a vacuum of 0.5 Torr, applying a plasma power of 200 watts at 50 kHz, and moving the substrate at a speed of 30 m/min.

The backcoat was applied using the following composition.

| Backcoat composition | Parts by weight |
|---|---|
| Carbon black | 7 |

-continued

| Backcoat composition | Parts by weight |
| --- | --- |
| SiO$_2$ | 2 |
| Acryl-modified vinyl chloride-vinyl acetate-vinyl alcohol copolymer | 30 |
| Acryl-modified polyurethane elastomer | 10 |
| Acrylic ester oligomer | 4 |
| Dispersing aid | 0.4 |

A mixture of the ingredients was milled for dispersion in a ball mill for 5 hours. The composition was coated on the plasma-treated rear surface of the substrate. It was exposed to electron radiation in a nitrogen atmosphere by operating an electrocurtain type electron accelerator at an accelerating voltage of 150 keV and an electrode current of 10 mA to a dose of 5 Mrad, obtaining a backcoat layer having a dry thickness of 0.5 μm.

Various samples thus prepared as shown in Table 11 were measured for some physical properties. It is to be noted that the inclination of grains in the lower layer with respect to a normal to the substrate surface is in the same direction as the medium is moved during recording/reproducing operation.

(1) Still life
Same as in Example 1.
(2) Electromagnetic property
Same as in Example 1.
(3) Corrosion resistance (Δφm/φm)
Same as in Example 1.
The results are shown in Table 12.

In Table 11, $(F/C)_T/(F/C)_B$ is the ratio of fluorine to carbon (F/C) in a top ⅓ region to a bottom ⅓ region of the topcoat.

TABLE 11

| Sample No. | Substrate thickness (μm) | Structure | θ min(°) Upper layer | θ min(°) Lower layer | Thickness (μm) Upper layer | Thickness (μm) Lower layer | Carbon/Metal Upper layer | Carbon/Metal Lower layer | $C_1$ | $C_1^*$ | $C_2$ | $C_2^*$ | $C_3$ | $O/(CO+Ni)$ $C_3/C_1$ | $C_2/C_1$ | Reactant | W/F.M (Joule/Kg) | C (at %) | F/C | C/H | H/F | $(F/C)_T/(F/C)_B$ | Thickness (Å) |
|---|---|---|---|---|---|---|---|---|---|---|---|---|---|---|---|---|---|---|---|---|---|---|---|
| 301 | 10 | 2 layers | 30 | 30 | 0.08 | 0.07 | ~$10^{-5}$ | ~$10^{-5}$ | 52 | 28 | 2 | 24 | 41 | 0.79 | 0.04 | $C_3F_6$ | $7 \times 10^8$ | 48 | 1.1 | — | — | 2.0 | 20 |
| 302 | 10 | 2 layers | 30 | 30 | 0.08 | 0.07 | ~$10^{-7}$ | ~$10^{-7}$ | 38 | 22 | 2 | 17 | 35 | 0.92 | 0.05 | $C_3F_6$ | $7 \times 10^8$ | 48 | 1.1 | — | — | 2.0 | 20 |
| 303 | 10 | 2 layers | 0 | 30 | 0.08 | 0.07 | ~$10^{-7}$ | ~$10^{-7}$ | 50 | 26 | 3 | 21 | 40 | 0.8 | 0.06 | $C_3F_6$ | $7 \times 10^8$ | 48 | 1.1 | — | — | 2.0 | 20 |
| 304 | 10 | 2 layers | 30 | 0 | 0.08 | 0.07 | ~$10^{-7}$ | ~$10^{-7}$ | 45 | 20 | 2 | 22 | 40 | 0.89 | 0.04 | $C_3F_6$ | $7 \times 10^8$ | 48 | 1.1 | — | — | 2.0 | 20 |
| 305 | 10 | 2 layers | 30 | 30 | 0.08 | 0.07 | — | — | 52 | 28 | 1 | 3 | 6 | 0.12 | 0.02 | $C_3F_6$ | $7 \times 10^8$ | 48 | 1.1 | — | — | 2.0 | 20 |
| 306 | 10 | 2 layers | 30 | 30 | 0.08 | 0.07 | ~$10^{-5}$ | ~$10^{-5}$ | 6 | 2 | 2 | 25 | 45 | 7.5 | 0.33 | $C_3F_6$ | $7 \times 10^8$ | 48 | 1.1 | — | — | 2.0 | 20 |
| 307 | 10 | 2 layers | 30 | 30 | 0.08 | 0.07 | ~$10^{-5}$ | ~$10^{-5}$ | 63 | 35 | 2 | 3 | 5 | 0.08 | 0.03 | $C_3F_6$ | $7 \times 10^8$ | 48 | 1.1 | — | — | 2.0 | 20 |
| 308 | 10 | 2 layers | 30 | 60 | 0.08 | 0.07 | ~$10^{-5}$ | ~$10^{-5}$ | 41 | 19 | 4 | 15 | 36 | 0.88 | 0.10 | $C_3F_6$ | $7 \times 10^8$ | 48 | 1.1 | — | — | 2.0 | 20 |
| 309 | 10 | 2 layers | 10 | 60 | 0.08 | 0.07 | ~$10^{-5}$ | ~$10^{-5}$ | 5 | 3 | 3 | 15 | 32 | 6.4 | 0.6 | $C_3F_6$ | $7 \times 10^8$ | 48 | 1.1 | — | — | 2.0 | 20 |
| 310 | 10 | 2 layers | 30 | 30 | 0.08 | 0.07 | ~$10^{-5}$ | ~$10^{-5}$ | 51 | 29 | 3 | 23 | 40 | 0.78 | 0.06 | $C_3F_6$ | $7 \times 10^8$ | 48 | 1.1 | — | — | 2.0 | 20 |
| 311 | 10 | 2 layers | 30 | 30 | 0.08 | 0.07 | ~$10^{-5}$ | ~$10^{-5}$ | 51 | 29 | 3 | 23 | 40 | 0.78 | 0.06 | $CH_4 + C_3F_6$ | $2 \times 10^{10}$ | 47 | 0.8 | 4.1 | 0.30 | 2.1 | 20 |
| 312 | 10 | 2 layers | 30 | 30 | 0.08 | 0.07 | ~$10^{-5}$ | ~$10^{-5}$ | 51 | 29 | 3 | 23 | 40 | 0.78 | 0.06 | $CH_4 + C_3F_6$ | $8 \times 10^7$ | 22 | 0.2 | 0.3 | 16.7 | 2.0 | 20 |
| 313 | 10 | 2 layers | 30 | 30 | 0.08 | 0.07 | ~$10^{-5}$ | ~$10^{-5}$ | 51 | 29 | 3 | 23 | 40 | 0.78 | 0.06 | $CH_4 + C_3F_6$ | $5 \times 10^{15}$ | 89 | 0.1 | 4.7 | 0.24 | 2.0 | 20 |
| 314 | 10 | 2 layers | 30 | 30 | 0.08 | 0.07 | ~$10^{-5}$ | ~$10^{-5}$ | 51 | 29 | 3 | 23 | 40 | 0.78 | 0.06 | $CH_4 + C_3F_6$ | $3 \times 10^8$ | 43 | 1.0 | 3.1 | 0.32 | 1.0 | 20 |
| 315* | 10 | 2 layers | 30 | 30 | 0.08 | 0.07 | <$10^{-8}$ | <$10^{-8}$ | 51 | 29 | 3 | 23 | 40 | 0.78 | 0.06 | — | — | — | — | — | — | — | — |
| 316 | 10 | 2 layers | 30 | 30 | 0.08 | 0.07 | <$10^{-8}$ | — | 51 | 29 | 3 | 23 | 40 | 0.78 | 0.06 | $C_3F_6$ | $7 \times 10^8$ | 48 | 1.1 | — | — | 2.0 | 20 |
| 317 | 10 | 2 layers | 30 | 30 | 0.08 | 0.07 | — | — | 51 | 29 | 3 | 23 | 40 | 0.78 | 0.06 | $C_3F_6$ | $7 \times 10^8$ | 48 | 1.1 | — | — | 2.0 | 20 |
| 318* | 10 | 2 layers | 30 | 30 | 0.08 | 0.07 | — | — | 51 | 29 | 3 | 23 | 40 | 0.78 | 0.06 | $C_3F_6$ | $7 \times 10^8$ | 48 | 1.1 | — | — | 2.0 | 20 |
| 319* | 10 | single | 30 | — | 0.08 | — | $10^{-5}$ | — | 40 | 23 | — | — | — | — | — | $C_3F_6$ | $7 \times 10^8$ | 48 | 1.1 | — | — | 2.0 | 20 |
| 320* | 10 | single | 30 | — | 0.08 | — | <$10^{-8}$ | — | 40 | 23 | — | — | — | — | — | $C_3F_6$ | $7 \times 10^8$ | 48 | 1.1 | — | — | 2.0 | 20 |
| 321* | 10 | single | 30 | — | 0.08 | — | — | — | 40 | 23 | — | — | — | — | — | — | — | — | — | — | — | — | — |
| 322* | 10 | single | 30 | — | 0.08 | — | — | — | 40 | 23 | — | — | — | — | — | — | — | — | — | — | — | — | 20 |
| 323* | 10 | 2 layers | 10 | 60 | 0.08 | 0.07 | — | — | 5 | 3 | 3 | 15 | 36 | 6.4 | 0.6 | — | — | — | — | — | — | — | — |
| 324 | 10 | 2 layers | 30 | 30 | 0.08 | 0.07 | ~$10^{-5}$ | ~$10^{-5}$ | 52 | 28 | 2 | 24 | 41 | 0.79 | 0.04 | $C_3F_6$ | $7 \times 10^8$ | 48 | 1.1 | — | — | 2.0 | 20 |

*Comparison

TABLE 12

| Sample No. | Still Life (min.) | Electromagnetic properties 0.75 MHz (dB) | 5 MHz (dB) | $\Delta\Phi m/\Phi m$ |
| --- | --- | --- | --- | --- |
| 301 | ≧60 | 4.1 | 4.5 | 2.0 |
| 302 | ≧60 | 4.0 | 4.4 | 2.3 |
| 303 | ≧60 | 4.1 | 2.5 | 2.4 |
| 304 | ≧60 | 2.1 | 3.6 | 2.3 |
| 305 | 25 | 3.7 | 4.2 | 2.1 |
| 306 | 5 | 1.7 | 2.1 | 2.0 |
| 307 | 50 | 1.6 | 1.7 | 1.9 |
| 308 | 35 | 2.2 | 2.5 | 2.1 |
| 309 | 5 | 0 | 0.5 | 2.3 |
| 310 | ≧60 | 4.3 | 4.5 | 1.9 |
| 311 | ≧60 | 4.2 | 4.6 | 2.0 |
| 312 | ≧60 | 4.1 | 4.7 | 2.8 |
| 313 | ≧60 | 4.2 | 4.5 | 2.9 |
| 314 | ≧60 | 4.1 | 4.5 | 2.6 |
| 315 | 5 | 4.2 | 4.4 | 3.0 |
| 316 | ≧60 | 4.1 | 4.6 | 3.5 |
| 317 | ≧60 | 4.2 | 4.5 | 3.4 |
| 318 | ≧60 | 4.2 | 4.5 | 3.6 |
| 319* | 15 | 0 | 0.1 | 2.2 |
| 320* | 10 | 0 | 0 | 4.1 |
| 321* | 10 | 0 | 0 | 3.5 |
| 322* | 10 | 0 | 0 | 16.0 |
| 323 | 0 | 0.1 | 0.5 | 15.5 |
| 324 | ≧60 | 4.1 | 4.5 | 1.5 |

*Comparison

EXAMPLE 8

The procedure for the preparation of the magnetic layer of Example 7 was repeated except that the thicknesses of the substrate and upper and lower magnetic layers were changed as shown in Table 13. Magnetic recording medium sample Nos. 331–339 as shown in Table 13 were completed by forming thereon the same backcoat and topcoat layers as in Example 7.

All the magnetic layers had a carbon-to-metal ratio of $10^{-5}:1$ regardless of whether they had a two or one layer structure.

The samples were tested for several properties by the same procedures as in Example 7. Measurements of electromagnetic property are calculated based upon an output of 0 dB for sample No. 339.

Coefficient of friction

The coefficient of dynamic friction of a sample was measured at 20° C., 60% RH.

The results are shown in Table 14.

In Table 14, increases in output of sample Nos. 331 to 335 (substrate thickness 7 μm, double magnetic layers) as compared with sample No. 337 (substrate thickness 7 μm, single magnetic layer) are also reported in parentheses.

TABLE 13

| Sample No. | Sub-strate thick-ness (μm) | Magnetic Layer Structure | θ min(°) Upper layer | θ min(°) Lower layer | Thickness (μm) Upper layer | Thickness (μm) Lower layer | Upper/Lower | $C_1$ | $C_1^*$ | $C_2$ | $O/(CO+Ni)$ $C_2^*$ | $C_3$ | $C_3/C_1$ | $C_2/C_1$ | Back-coat | Topcoat layer (Plasma-polymerized film) Reactant | W/F.M (Joule/Kg) | C (at %) | F/C | C/H | H/F | $(F/C)_T/(F/C)_B$ | Thick-ness (Å) |
|---|---|---|---|---|---|---|---|---|---|---|---|---|---|---|---|---|---|---|---|---|---|---|---|
| 331 | 7 | 2 layers | 30 | 30 | 0.05 | 0.10 | 0.5 | 39 | 20 | 2 | 15 | 35 | 0.90 | 0.05 | Yes | $C_3F_6$ | $7 \times 10^8$ | 48 | 1.1 | — | — | 2.0 | 20 |
| 332 | 7 | 2 layers | 30 | 30 | 0.08 | 0.07 | 1.14 | 47 | 21 | 3 | 20 | 41 | 0.87 | 0.06 | Yes | $C_3F_6$ | $7 \times 10^8$ | 48 | 1.1 | — | — | 2.0 | 20 |
| 333 | 7 | 2 layers | 10 | 60 | 0.10 | 0.05 | 2.0 | 6 | 3 | 2 | 16 | 35 | 5.8 | 0.33 | Yes | $C_3F_6$ | $7 \times 10^8$ | 48 | 1.1 | — | — | 2.0 | 20 |
| 334 | 7 | 2 layers | 30 | 30 | 0.05 | 0.10 | 0.5 | 38 | 22 | 2 | 17 | 35 | 0.92 | 0.05 | Yes | $CH_4 + C_3F_6$ | $2 \times 10^8$ | 47 | 0.8 | 4.1 | 0.30 | 2.1 | 20 |
| 335 | 7 | 2 layers | 30 | 30 | 0.05 | 0.10 | 0.5 | 38 | 22 | 2 | 17 | 35 | 0.92 | 0.05 | Yes | $CH_4 + C_3F_6$ | $8 \times 10^7$ | 22 | 0.2 | 0.3 | 16.7 | 2.0 | 20 |
| 336 | 10 | 2 layers | 30 | 30 | 0.05 | 0.10 | 0.5 | 38 | 23 | 2 | 19 | 35 | 0.92 | 0.05 | Yes | $CH_4 + C_3F_6$ | $2 \times 10^8$ | 47 | 0.8 | 4.1 | 0.30 | 2.1 | 20 |
| 337* | 7 | single | | 30 | | 0.15 | | 41 | 20 | — | — | — | — | — | Yes | $CH_4 + C_3F_6$ | $2 \times 10^8$ | 47 | 0.8 | 4.1 | 0.30 | 2.1 | 20 |
| 338* | 7 | single | | 30 | | 0.15 | | 41 | 20 | — | — | — | — | — | Yes | — | — | — | — | — | — | — | — |
| 339* | 10 | single | | 30 | | 0.15 | | 40 | 23 | — | — | — | — | — | Yes | $CH_4 + C_3F_6$ | $2 \times 10^8$ | 47 | 0.8 | 4.1 | 0.30 | 2.1 | 20 |

*Comparison

TABLE 14

| Sample No. | Still Life (min.) | Electromagnetic properties 0.75 MHz (dB) | 5 MHz (dB) | Coefficient of friction |
|---|---|---|---|---|
| 331 | ≧60 | +5.0 (6.3) | +5.1 (7.2) | 0.19 |
| 332 | ≧60 | +3.1 (4.4) | +3.5 (5.6) | 0.20 |
| 333 | 5 | −1.0 (0.3) | −1.1 (1.0) | 0.19 |
| 334 | ≧60 | +5.1 (6.4) | +5.3 (7.4) | 0.20 |
| 335 | ≧60 | +5.0 (6.3) | +5.0 (7.1) | 0.28 |
| 336 | ≧60 | +5.7 | +5.5 | 0.22 |
| 337* | 15 | −1.3 (0) | −2.1 (0) | 0.24 |
| 338* | 15 | 0 | 0.1 | 0.56 |
| 339* | 15 | 0 | 0 | 0.20 |

*Comparison

The benefits of the present invention are evident from the data of Tables 11–14.

the best performance was observed with those samples having a magnetic layer structure and a plasma-polymerized film as defined by the present invention.

For substrates having a thickness of up to 8 μm, marked improvements in durability and 5 MHz output are observed (sample No. 331) when the thickness ratio of the upper to lower layers ranges from 2:10 to 9:10. Even with those substrates which are otherwise too thin to produce an acceptable 5 MHz output, the present invention enables magnetic recording media to exhibit practically satisfactory electromagnetic properties and durability.

EXAMPLE 9

Colloidal silica was coated onto the surface of a substrate on which a magnetic layer was to be subsequently formed, forming minute protrusions on the substrate. The protrusion was 250 Å high and distributed at a density of $5 \times 10^7/mm^2$.

the manufacturing and testing procedures of Examples 5 and 6 were repeated using the substrate having such protrusions. It was found that the amount of material adhered to the head during high-temperature operation was reduced by about 30–40%.

EXAMPLE 10 the procedure of Example 7 was repeated except that a plasma-polymerized interlayer was formed between the upper and lower layer of the two-layer structure.

The substrate having the ferromagnetic metal thin film lower layer formed thereon was placed in a vacuum chamber which was once evacuated to a vacuum of $10^{-3}$ Torr. A 1/1 mixture of $CH_4$ as reactant gas and Ar as carrier gas was introduced into the chamber so as to maintain a gas pressure of 0.1 Torr. A radio frequency voltage was applied at 13.56 MHz to generate a plasma flame, with which the reactant was polymerized to form a plasma-polymerized film. The parameter W/F.M was set to $5 \times 10^8$ joule/kg and the plasma-polymerized film had a thickness of 25 Å and a C/H ration of 2.

The manufacturing and testing procedures of Example 7 were repeated except the interposition of the plasmapolymerized interlayer. It was found that the rupture strength was increased by about 20–30%.

We claim:

1. In a magnetic recording medium comprising a plastic substrate and a ferromagnetic metal thin film comprised predominately of cobalt on the substrate, the improvement wherein said ferromagnetic metal thin film has a multi-layered structure including at least two layers, a lowermost layer adjoining the substrate and an uppermost layer remote from the substrate, at least one of which contains carbon, wherein the quotient C2/C1 is up to 0.3 provided that the lowermost layer has an oxygen concentration C2 at its interface with said substrate and the uppermost layer has an oxygen concentration C1 at its surface remote from said substrate.

2. In a magnetic recording medium comprising a plastic substrate and a ferromagnetic metal thin film comprised predominately of cobalt on the substrate, the improvement wherein said ferromagnetic metal thin film has a multi-layered structure including at least two layers, a lowermost layer adjoining the substrate and an uppermost layer remote from the substrate, at least on of which contains carbon, and wherein the quotient C3/C1 ranges from 0.1–3.0 provided that a layer directly adjoining the uppermost layer has an oxygen concentration C3 at its interface with said uppermost layer and the uppermost layer has an oxygen concentration C1 at its surface remote from said substrate.

3. The magnetic recording medium of claim 1 or 2 wherein the carbon-containing layer has an atom ratio of carbon to metal of from $10^{-8}:1$ to $10^{-2}:1$.

4. The magnetic recording medium of claim 1 or 2 wherein the total ferromagnetic metal thin film has an atom ration of carbon to metal of from $10^{-8}:1$ to $10^{-2}:1$.

5. The magnetic recording medium of claim 1 or 2 wherein said layers are formed by evaporating a ferromagnetic metal material, the minimum incident angle at which the evaporated metal material is deposited on the substrate is set 50° C. or lower during formation of the lowermost layer and ranges from 20° C. to 90° C. during formation of the uppermost layer.

6. The magnetic recording medium of claim 1 or 2 wherein the ferromagnetic metal thin film is of a two-layer structure.

7. The magnetic recording medium of claim 1 or 2, which further comprises a topcoat layer on said ferromagnetic metal thin film, said topcoat layer comprising a plasma-polymerized film containing carbon and fluorine, the carbon content ranging from 30–80 atom %.

8. The magnetic recording medium of claim 1 or 2, which further comprises a topcoat layer on said ferromagnetic metal thin film, said topcoat layer comprising a plasma-polymerized film containing carbon, fluorine and hydrogen, the carbon content ranging from 30–80 atom %.

9. The magnetic recording medium of claim 1, wherein the quotient C3/C1 ranges from 0.1–3.0 provided that a layer directly adjoining the uppermost layer has an oxygen concentration C3 at its interface with said uppermost layer and the uppermost layer has an oxygen concentration C1 at its surface remote from said substrate.

10. The magnetic recording medium of claim 1 or 2, which further comprises a plasma-polymerized film disposed between the lowermost layer and the substrate.

11. The magnetic recording medium of claim 10 wherein the plasma-polymerized film is comprised of carbon or carbon and at least one element selected from the group consisting of hydrogen, nitrogen and oxygen.

12. The magnetic recording medium of claim 11 wherein the plasma-polymerized film comprised of 30 to 100 atom % of carbon.

13. The magnetic recording medium of claim 11 wherein in the plasma-polymerized film, the atom ratio of C/H ranges from 1:1 to 6:1.

14. The magnetic recording medium of claim 11 wherein the plasma-polymerized film has a thickness of 3 to 80 Å.

15. The magnetic recording medium of claim 1 or 2, which further comprises a plasma-polymerized film disposed between any two adjoining layers of the ferromagnetic metal thin film.

16. The magnetic recording medium of claim 1 or 2, which further comprises a plasma-polymerized film disposed on the surface of the uppermost layer remote from the substrate.

17. The magnetic recording medium of claim 15, wherein the plasma-polymerized film is comprised of carbon and at least one optional element selected from hydrogen, nitrogen and oxygen.

18. The magnetic recording medium of claim 16, wherein the plasma-polymerized film is comprised of carbon and at least one optional element selected from hydrogen, nitrogen and oxygen.

19. The magnetic recording medium of claim 18 wherein in the plasma-polymerized topcoat film, the hydrogen-to-fluorine atom ratio is up to 1.0.

20. The magnetic recording medium of claim 19 wherein in the plasma-polymerized topcoat film, the fluorine-to-carbon atom ratio being from 3/10 to 2/1.

21. The magnetic recording medium of claim 20 wherein the plasma-polymerized topcoat film comprises carbon, fluorine, and hydrogen, the carbon-to-hydrogen and hydrogen-to-fluorine atom ratios being from 2/1 to 8/1 and from 2/10 to 1/1, respectively.

22. The magnetic recording medium of claim 19 wherein the topcoat film has a thickness of 3 to 80 Å.

23. The magnetic recording medium of claim 19 wherein in the plasma-polymerized topcoat film, the average fluorine-to-carbon atom ratio (F/C) in the region of said film that extends from the surface remote from the substrate to $\frac{1}{3}$rd of its thickness is at least 1.5 times that in the region of the film that extends from the surface adjacent to the substrate to $\frac{1}{3}$rd of its thickness.

24. The magnetic recording medium of claim 19 which further comprises a plasma-polymerized interlayer disposed between the lowermost layer and the substrate or between any two adjoining layers of the ferromagnetic metal thin film, said interlayer containing carbon, or carbon and at least one elements selected from hydrogen, nitrogen and oxygen.

* * * * *

UNITED STATES PATENT AND TRADEMARK OFFICE
CERTIFICATE OF CORRECTION

PATENT NO. : 4,900,622

DATED : FEBRUARY 13, 1990

INVENTOR(S) : Masatoshi NAKAYAMA et al

It is certified that error appears in the above-identified patent and that said Letters Patent is hereby corrected as shown below:

Column 60

Claim 4, line 3: "ration" should read -- ratio --.

Claim 5, line 5: delete "C.";
line 6: delete "C." (both occurrences).

Signed and Sealed this

Third Day of December, 1991

Attest:

HARRY F. MANBECK, JR.

Attesting Officer

Commissioner of Patents and Trademarks